US011967501B2

(12) United States Patent
Hiramatsu et al.

(10) Patent No.: US 11,967,501 B2
(45) Date of Patent: *Apr. 23, 2024

(54) SUBSTRATE PROCESSING APPARATUS AND METHOD OF MANUFACTURING SEMICONDUCTOR DEVICE

(71) Applicant: Kokusai Electric Corporation, Tokyo (JP)

(72) Inventors: Hiroaki Hiramatsu, Toyama (JP); Shuhei Saido, Toyama (JP); Takuro Ushida, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/582,844

(22) Filed: Jan. 24, 2022

(65) Prior Publication Data

US 2022/0145464 A1 May 12, 2022

Related U.S. Application Data

(63) Continuation of application No. 17/017,147, filed on Sep. 10, 2020, now Pat. No. 11,261,528, which is a
(Continued)

(51) Int. Cl.
*C23C 16/40* (2006.01)
*B25B 11/00* (2006.01)
(Continued)

(52) U.S. Cl.
CPC ........ *H01L 21/0217* (2013.01); *B25B 11/005* (2013.01); *C23C 16/4412* (2013.01);
(Continued)

(58) Field of Classification Search
CPC ................ C23C 16/52; C23C 16/4412; C23C 16/45578; C23C 16/481; C23C 16/44;
(Continued)

(56) References Cited

U.S. PATENT DOCUMENTS

| 5,925,188 A | 7/1999 | Oh |
| 7,294,582 B2 | 11/2007 | Haverkort et al. |

(Continued)

FOREIGN PATENT DOCUMENTS

| CN | 102634773 A | 8/2012 |
| CN | 104947080 A | 9/2015 |

(Continued)

OTHER PUBLICATIONS

Office Action in corresponding Singapore Patent Application No. 11202008792X, dated Apr. 25, 2022.
(Continued)

*Primary Examiner* — Rudy Zervigon
(74) *Attorney, Agent, or Firm* — Edell, Shapiro & Finnan, LLC

(57) ABSTRACT

Described herein is a technique capable of improving a film uniformity on a surface of a substrate and a film uniformity among a plurality of substrates including the substrate. According to one aspect thereof, there is provided a substrate processing apparatus including: a substrate retainer including: a product wafer support region, an upper dummy wafer support region and a lower dummy wafer support region; a process chamber in which the substrate retainer is accommodated; a first, a second and a third gas supplier; and an exhaust system. Each of the first gas and the third gas supplier includes a vertically extending nozzle with holes, wherein an upper of an uppermost hole and a lower end of a lowermost hole are arranged corresponding to an uppermost and a lowermost dummy wafer, respectively. The second gas supplier includes a nozzle with holes or a slit.

20 Claims, 13 Drawing Sheets

Related U.S. Application Data continuation of application No. PCT/JP2018/011625, filed on Mar. 23, 2018.

(51) Int. Cl.
| | |
|---|---|
| *C23C 16/44* | (2006.01) |
| *C23C 16/455* | (2006.01) |
| *C23C 16/48* | (2006.01) |
| *C23C 16/52* | (2006.01) |
| *H01L 21/02* | (2006.01) |

(52) U.S. Cl.
CPC ...... *C23C 16/45578* (2013.01); *C23C 16/481* (2013.01); *C23C 16/52* (2013.01)

(58) Field of Classification Search
CPC ........ C23C 16/45574; C23C 16/45523; C23C 16/45546; B25B 11/005; H01L 21/205; H01L 21/683; H01L 21/67303; B05D 1/40
USPC ............... 118/715, 719; 156/345.29, 345.31, 156/345.32
See application file for complete search history.

(56) References Cited

U.S. PATENT DOCUMENTS

| | | | |
|---|---|---|---|
| 7,629,256 B2 | 12/2009 | Hasper | |
| 7,718,518 B2 | 5/2010 | Zagwijn et al. | |
| 10,006,146 B2 | 6/2018 | Park et al. | |
| 10,081,868 B2 | 9/2018 | Takagi et al. | |
| 10,224,185 B2 | 3/2019 | Noh et al. | |
| 10,364,498 B2 | 7/2019 | Terada et al. | |
| 10,453,735 B2 | 10/2019 | Okajima et al. | |
| 10,655,218 B2 | 5/2020 | Kamakura | |
| 10,822,694 B2 | 11/2020 | Ching et al. | |
| 10,907,253 B2 | 2/2021 | Hiramatsu et al. | |
| 11,261,528 B2* | 3/2022 | Hiramatsu | C23C 16/45578 |
| 2003/0111013 A1* | 6/2003 | Oosterlaken | C23C 16/45578 118/724 |
| 2006/0088985 A1 | 4/2006 | Haverkort et al. | |
| 2006/0159847 A1 | 7/2006 | Porter et al. | |
| 2008/0035055 A1 | 2/2008 | Dip et al. | |
| 2008/0075838 A1 | 3/2008 | Noue et al. | |
| 2009/0087964 A1 | 4/2009 | Maeda et al. | |
| 2010/0035440 A1 | 2/2010 | Fukuda et al. | |
| 2010/0218724 A1 | 9/2010 | Okada | |
| 2012/0199067 A1* | 8/2012 | Morozumi | C23C 16/4412 118/719 |
| 2013/0017503 A1* | 1/2013 | De Ridder | F27B 17/0025 432/77 |
| 2014/0357058 A1* | 12/2014 | Takagi | C23C 16/45534 118/724 |
| 2015/0275368 A1 | 10/2015 | Motoyama et al. | |
| 2015/0275369 A1 | 10/2015 | Terada et al. | |
| 2017/0051408 A1* | 2/2017 | Takagi | C23C 16/45578 |
| 2017/0253969 A1 | 9/2017 | Inaba et al. | |
| 2017/0294318 A1 | 10/2017 | Yoshida et al. | |
| 2018/0135176 A1 | 5/2018 | Morikawa et al. | |
| 2018/0135179 A1 | 5/2018 | Ikeuchi et al. | |
| 2018/0264516 A1 | 9/2018 | Fujikawa et al. | |
| 2018/0363137 A1 | 12/2018 | Takagi et al. | |
| 2019/0093230 A1* | 3/2019 | Fukushima | H01L 21/67017 |
| 2019/0330738 A1* | 10/2019 | Saido | C23C 16/4584 |
| 2020/0098555 A1 | 3/2020 | Ebata et al. | |
| 2020/0407851 A1 | 12/2020 | Hiramatsu et al. | |

FOREIGN PATENT DOCUMENTS

| | | |
|---|---|---|
| JP | 2001110730 A | 4/2001 |
| JP | 2009-295729 A | 12/2009 |
| JP | 2010-62528 A | 3/2010 |
| JP | 2011249407 A | 12/2011 |
| JP | 4929811 B2 | 5/2012 |
| JP | 2012-169307 A | 9/2012 |
| JP | 2014063959 A | 4/2014 |
| JP | 5658463 B2 | 1/2015 |
| JP | WO2015041376 A1 | 3/2015 |
| JP | 2015-173154 A | 10/2015 |
| JP | 5958231 B2 | 7/2016 |
| JP | 6084298 B2 | 2/2017 |
| JP | 2017028256 A | 2/2017 |
| WO | 2015045137 A1 | 4/2015 |

OTHER PUBLICATIONS

The First Review of the Opinion of the Notice with English translation in Chinese Application No. 201880048953.1, dated Feb. 11, 2023, 26 pages.

* cited by examiner

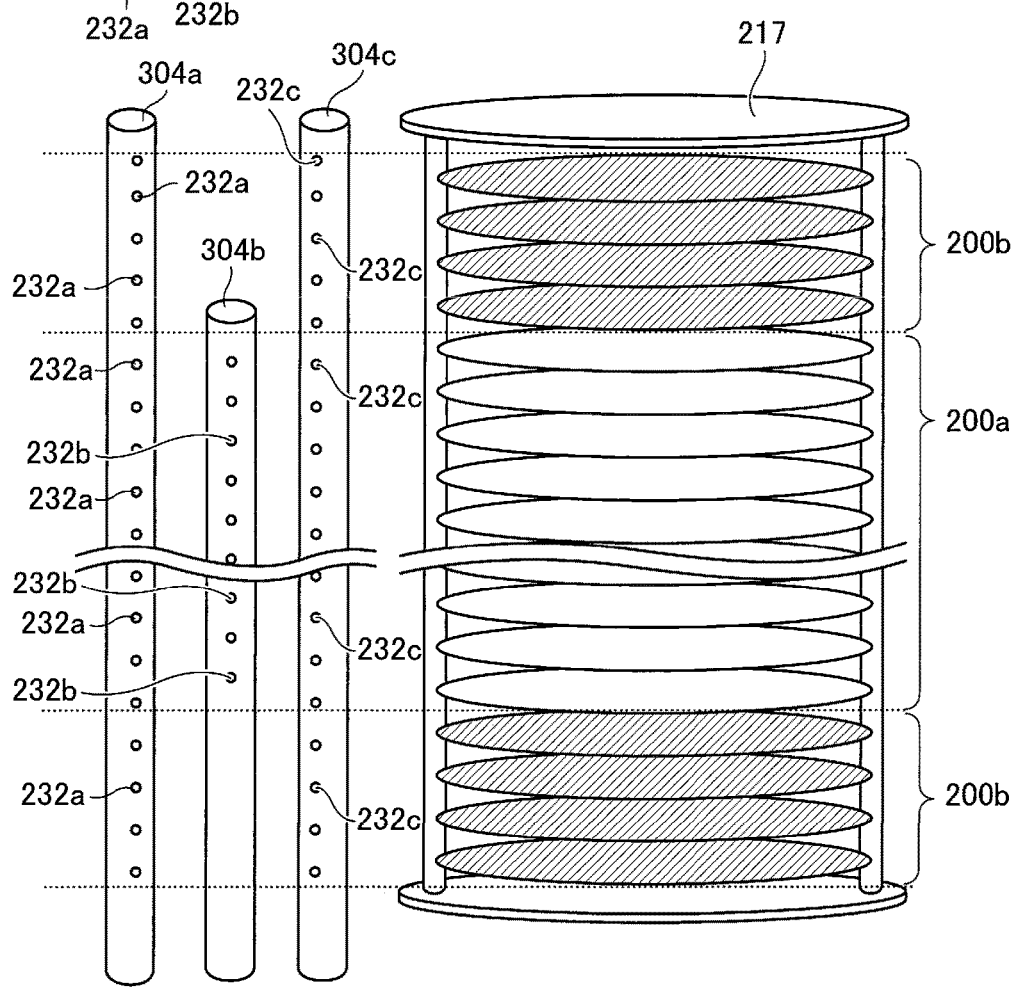

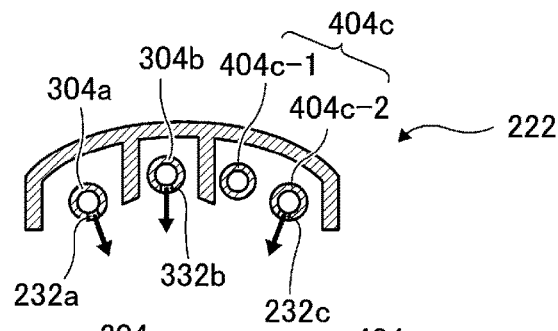
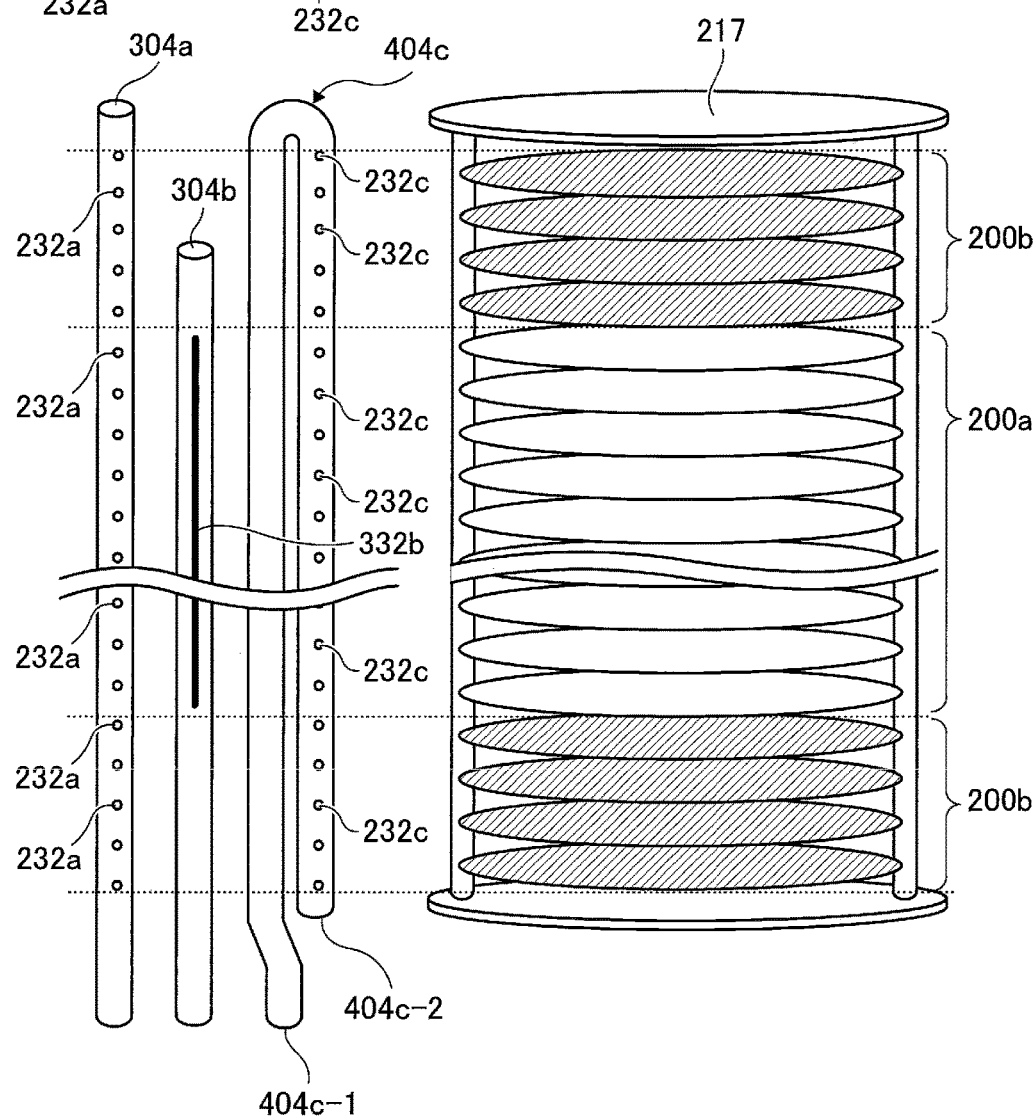

SUBSTRATE PROCESSING APPARATUS AND METHOD OF MANUFACTURING SEMICONDUCTOR DEVICE

CROSS REFERENCE TO RELATED APPLICATIONS

This application is a continuation of U.S. patent application Ser. No. 17/017,147 filed Sep. 10, 2020, which is a continuation of International Application No. PCT/JP2018/011625, filed on Mar. 23, 2018, the entire contents of which are hereby incorporated by reference.

TECHNICAL FIELD

The present disclosure relates to a substrate processing apparatus and a method of manufacturing a semiconductor device.

BACKGROUND

As a part of manufacturing processes of a semiconductor device, a process of forming a film on a substrate using a plurality of nozzles may be performed.

SUMMARY

Described herein is a technique capable of improving a uniformity of a film on a surface of a substrate and a uniformity of the film among a plurality of substrates.

According to one aspect of the technique of the present disclosure, there is provided a processing apparatus including: a substrate retainer including: a product wafer support region where a plurality of product wafers with a pattern formed thereon are arranged and supported; an upper dummy wafer support region provided above the product wafer support region and capable of supporting a plurality of dummy wafers; and a lower dummy wafer support region provided below the product wafer support region and capable of supporting a plurality of dummy wafers; a process chamber in which the substrate retainer is accommodated; a first gas supplier, a second gas supplier and a third gas supplier configured to supply gases into the process chamber; and an exhaust system configured to exhaust an inner atmosphere of the process chamber, wherein each of the first gas supplier and the third gas supplier includes a nozzle of a pipe shape extending in a vertical direction along the substrate retainer, a plurality of gas supply holes being provided at each of the first gas supplier and the third gas supplier, wherein an upper end of an uppermost gas supply hole among the plurality of the gas supply holes is arranged corresponding to an uppermost dummy wafer among the plurality of the dummy wafers supported in the upper dummy wafer support region and a lower end of a lowermost gas supply hole among the plurality of the gas supply holes is arranged corresponding to a lowermost dummy wafer among the plurality of the dummy wafers supported in the lower dummy wafer support region, wherein the second gas supplier includes a nozzle extending in the vertical direction along the substrate retainer and at which a gas supply port is provided, and wherein the gas supply port is constituted by a plurality of gas supply holes or by a slit-shaped opening.

BRIEF DESCRIPTION OF THE DRAWINGS

FIG. 4A schematically illustrates a horizontal cross-section of nozzles and adjacent structures thereof according to the embodiment described herein, and FIG. 4B schematically illustrates a positional relationship between the nozzles according to the embodiment described herein and a substrate accommodated in a substrate retainer.

FIG. 7A schematically illustrates a horizontal cross-section of nozzles and periphery thereof according to a third modified example described herein, and FIG. 7B schematically illustrates a positional relationship between the nozzles according to the third modified example described herein and the substrate accommodated in the substrate retainer.

DETAILED DESCRIPTION

Embodiment of Present Disclosure

Hereinafter, an embodiment according to the technique of the present disclosure will be described with reference to FIGS. 1 through 4. A substrate processing apparatus according to the embodiment of the technique is configured as an example of a semiconductor manufacturing apparatus used for manufacturing a semiconductor device.

(1) Configuration of Substrate Processing Apparatus

Figure 1:
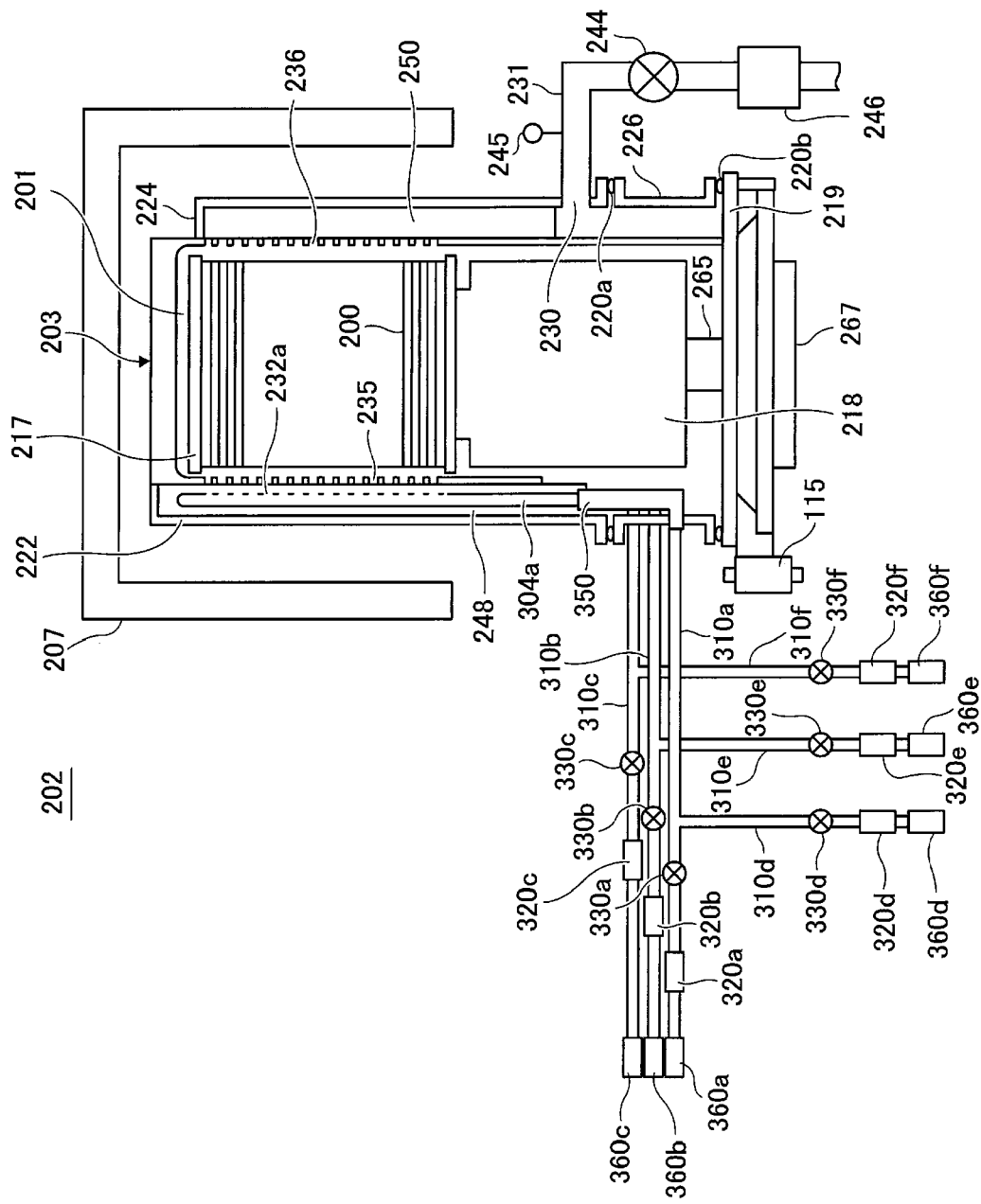
FIG. 1 schematically illustrates a vertical cross-section of a vertical type process furnace of a substrate processing apparatus preferably used in an embodiment described herein.

As shown in FIG. 1, a process furnace 202 of the substrate processing apparatus according to the present embodiment includes a heater 207 serving as a heating apparatus (heating structure). The heater 207 is of a cylindrical shape, and is vertically installed while being supported by a heater base (not shown) serving as a support plate. The heater 207 also functions as an activator (exciter) capable of activating (exciting) a process gas by heat.

A reaction tube 203 is provided in an inner side of the heater 207 so as to be coaxially aligned with the heater 207. A reaction vessel (which is a process vessel) is constituted by the reaction tube 203. For example, the reaction tube 203 is made of a heat resistant material such as quartz (SiO2) and silicon carbide (SiC). The reaction tube 203 is of a cylindrical shape with an open lower end and a closed upper end. The upper end of the reaction tube 203 is closed by a flat wall body. That is, the reaction tube 203 includes a ceiling. A cylindrical portion 209 of a cylindrical shape is provided at a side wall of the reaction tube 203. A gas supply area (buffer) 222 and a gas exhaust area 224 are provided on an outer wall of the cylindrical portion 209. A process chamber 201 is provided in the cylindrical portion 209 of the reaction tube 203. A plurality of wafers including a wafer 200 serving as a substrate is processed in the process chamber 201 under a high temperature and a reduced pressure. The process chamber 201 is configured to accommodate a boat 217 serving as a substrate retainer capable of accommodating (supporting or holding) the plurality of the wafers including the wafer 200 vertically arranged in a horizontal orientation in a multistage manner.

The gas supply area 222 is configured to protrude outward from a sidewall of the cylindrical portion 209 of the reaction tube 203. An outer wall of the gas supply area 222 is connected to the outer wall of cylindrical portion 209, and is provided concentrically with the cylindrical portion 209. A diameter of the gas supply area 222 is greater than an outer diameter of the cylindrical portion 209. A lower end of the gas supply area 222 is open, and an upper end of the gas supply area 222 is closed by a flat wall body. Nozzles 304a, 304b and 304c which will be described later are accommodated in the gas supply area 222 along a longitudinal direction (that is, the vertical direction) of the gas supply area 222. A partition wall 252, which serves as a part of the sidewall of the cylindrical portion 209, constitutes a boundary between the gas supply area 222 and the cylindrical portion 209. Gas supply slits 235 are opened on the partition wall 252, and are configured to communicate (connect) with insides of the gas supply area 222 and the process chamber 201. The gas supply slits 235 may be arranged in a grid pattern including a plurality of rows and a plurality of columns. Preferably, three columns of the gas supply slits 235 are arranged in a circumferential direction of the gas supply area 222 so as to allow each region of the gas supply area 222 to separately communicate with the process chamber 201, and a plurality of rows of the gas supply slits 235, each of which includes three of the gas supply slits 235, are arranged in a manner respectively corresponding to the surfaces (upper surfaces) of the plurality of the wafers including the wafer 200 such that the number of the rows is equal to the number of the wafers counted along the longitudinal direction of the gas supply area 222.

The gas exhaust area 224 protrudes outward from a sidewall of the cylindrical portion 209 facing the sidewall where the gas supply area 222 is provided. The plurality of the wafers including the wafer 200 are accommodated in the process chamber 201 between the gas supply area 222 and the gas exhaust area 224. An outer wall of the gas exhaust area 224 is connected to the outer wall of the cylindrical portion 209, and is aligned along a circle which shares its center with the cylindrical portion 209 and whose outer diameter is greater than that of the cylindrical portion 209. A lower end and an upper end of the gas exhaust area 224 are closed by flat wall bodies, respectively.

Gas exhaust slits 236 described later are provided on a partition wall 254 which is a wall body constituting a boundary between the gas exhaust area 224 and the cylindrical portion 209. The partition wall 254 serves as a part of the cylindrical portion 209, and a part of an outer surface of the partition wall 254 constitutes a side surface facing the gas exhaust area 224. Thereby, the reaction tube 203 includes a double tube structure where the gas supply area 222 and the gas exhaust area 224 are provided.

The lower end of the reaction tube 203 is supported by a manifold 226 of a cylindrical shape. For example, the manifold 226 is made of a metal such as nickel alloy and stainless steel, or is made of a heat resistant material such as quartz (SiO$_2$) and silicon carbide (SiC). A flange (not shown) is provided at an upper end of the manifold 226, and the lower end of the reaction tube 203 is provided on the flange and supported by the flange. A seal 220a such as an O-ring is provided between the flange and the upper end of the reaction tube 203 to airtightly seal an inside of the reaction tube 203.

A seal cap 219 is airtightly attached to a lower end opening of the manifold 226 via a seal 220b such as an O-ring. The seal cap 219 is configured to airtightly seal a lower end opening of the reaction tube 203, that is, the lower end opening of the manifold 226. For example, the seal cap 219 is made of a metal such as nickel alloy and stainless steel, and is of a disk shape. The seal cap 219 may be configured such that an inner surface of the seal cap 219 is covered with a heat resistant material such as quartz (SiO$_2$) and silicon carbide (SiC).

A boat support 218 configured to support the boat 217 is provided on the seal cap 219. The boat support 218 is made of a heat resistant material such as quartz and SiC. The boat support 218 functions not only as a support capable of supporting the boat 217 but also as a heat insulator. The boat 217 is provided vertically on the boat support 218. For example, the boat 217 is made of a heat resistant material such as quartz and SiC. The boat 217 includes a bottom plate that can be placed on the boat support 218 and a top plate provided above the bottom plate. A plurality of support columns are provided between the bottom plate and the top plate. The plurality of the support columns are installed to connect the bottom plate and the top plate. The boat 217 accommodates (supports) the plurality of the wafers including the wafer 200. The plurality of the wafers is horizontally oriented with predetermined intervals therebetween. That is, the plurality of the wafers is supported by the plurality of the support columns of the boat 217 with their centers aligned with each other. A stacking direction of the plurality of the wafers is equal to an axial direction of the reaction tube 203.

A boat rotator 267 configured to rotate the boat 217 is provided at the seal cap 219 opposite to the process chamber 201. A rotating shaft 265 of the boat rotator 267 is connected to the boat support 218 through the seal cap 219. As the boat rotator 267 rotates the boat 217 via the boat support 218, the plurality of the wafers including the wafer 200 supported by the boat 217 are rotated.

The seal cap 219 may be elevated or lowered in the vertical direction by a boat elevator 115 provided outside the reaction tube 203. The boat elevator 115 serves as an elevator. As the seal cap 219 is elevated or lowered in the vertical direction by the boat elevator 115, the boat 217 is transferred (loaded) into the process chamber 201 or transferred (unloaded) out of the process chamber 201.

Nozzle supports 350, which are configured to support the nozzles (which are injectors) 304a, 304b and 304c, respectively, are installed at the manifold 226 so as to pass through the manifold 226. The nozzle supports 350 are bent in an L shape. According to the present embodiment, for example, three nozzle supports are installed as the nozzle supports 350. For example, the nozzle supports 350 are made of a material such as nickel alloy and stainless steel. Gas supply pipes 310a, 310b and 310c configured to supply gases such as the process gas into the process chamber 201 are connected to first ends of the nozzle supports 350, respectively. The nozzles 304a, 304b and 304c are connected to second ends of the nozzle supports 350, respectively. For example, the nozzles 304a, 304b and 304c of a pipe shape are made of a heat resistant material such as quartz and SiC.

Figure 2:
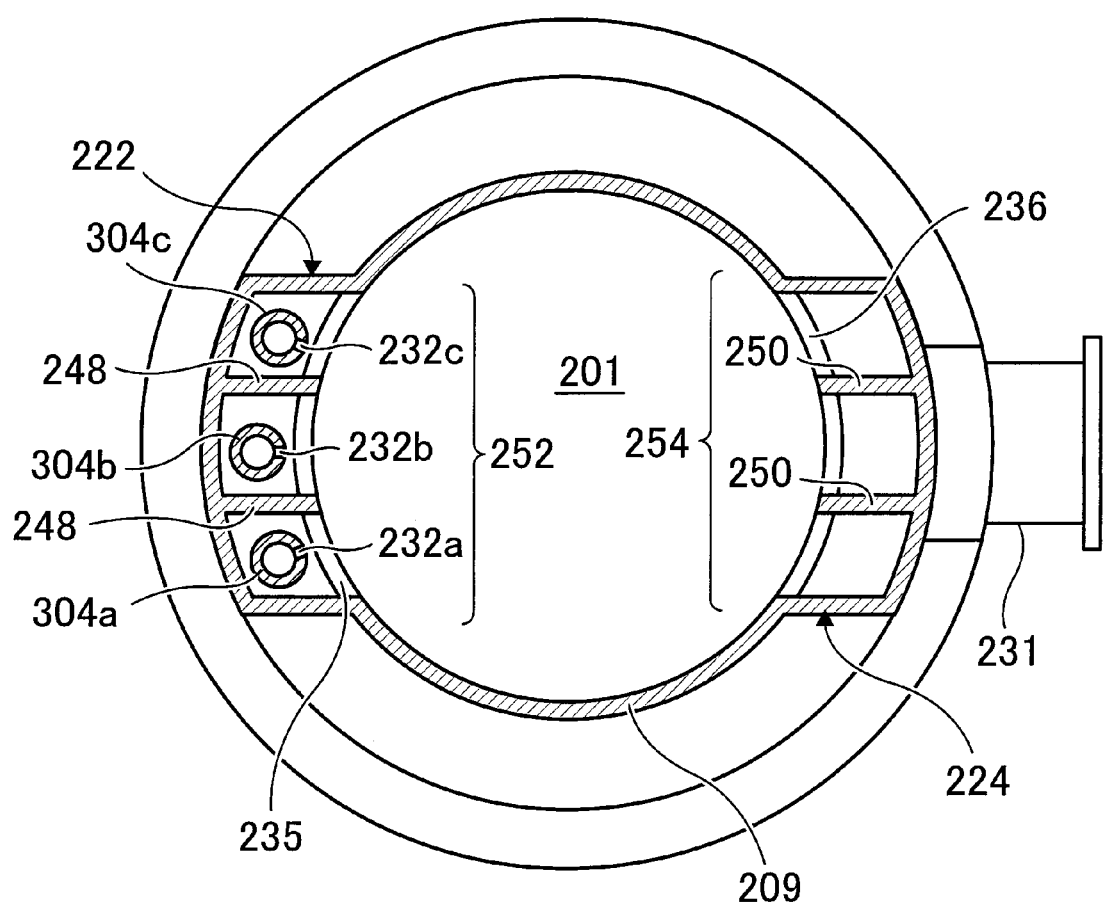
FIG. 2 schematically illustrates a horizontal cross-section of a part of the vertical type process furnace of the substrate processing apparatus preferably used in the embodiment described herein.

As shown in FIG. 2, inner walls 248 and inner walls 250 are provided inside the gas supply area 222 and the gas exhaust area 224, respectively, so as to divide (partition) inner spaces of each of the gas supply area 222 and the gas exhaust area 224 into a plurality of spaces. The gas supply area 222, the inner walls 248 and the inner walls 250 are made of the same material as the reaction tube 203, for example, a heat resistant material such as quartz or SiC. According to the present embodiment, for example, two inner walls are provided as the inner walls 248 and two inner walls are provided as the inner walls 250. Thus, the inner space of each of the gas supply area 222 and the gas exhaust area 224 is divided into three spaces.

The two inner walls 248 are provided so as to divide (partition) the inner space of the gas supply area 222 from a lower end to an upper end thereof into a plurality of spaces. As a result, for example, the three spaces separated by the two inner walls 248 are provided. The nozzles 304a, 304b and 304c are provided in the plurality of the spaces, respectively. Thus, it is possible to suppress the process gas supplied through the nozzles 304a, 304b and 304c from mixing with one another in the gas supply area 222. With the configuration of the gas supply area 222 described above, it is possible to suppress the formation of a film or the generation of by-products in the gas supply area 222 due to the mixing of the process gas in the gas supply area 222. Preferably, the inner walls 248 are provided so as to divide the gas supply area 222 from the lower end to the upper end thereof such that the three spaces separated from one another are provided.

Similar to the inner walls 248, the two inner walls 250 are provided so as to divide (partition) the inner space of the gas exhaust area 224 into a plurality of spaces. Preferably, the inner walls 250 are provided so as to divide the gas exhaust area 224 from the vicinity of an upper end thereof to the vicinity of an exhaust port 230 described later. Preferably, when an outer diameter of the outer wall of the gas supply area 222 is the same as the an outer diameter of an outer wall of the gas exhaust area 224, it is possible to suppress the distortion of the reaction tube 203 and to reduce a dead space between the heater 207 and the reaction tube 203. For the same reason, it is preferable that a cross-sectional area of a flow path of the gas in the gas supply area 222 is the same as a cross-sectional area of a flow path of the gas in the gas exhaust area 224. In addition, preferably, a cross-sectional area of the flow path of the gas in each space in the gas supply area 222 is the same as a cross-sectional area of the flow path of the gas in each space in the gas exhaust area 224 facing each space in the gas supply area 222. In addition, preferably, the gas exhaust slits 236 are provided similar to the gas supply slits 235.

A source (source gas) containing a predetermined element (main element) constituting a film is supplied into the process chamber 201 from a gas supply source 360b serving as a second gas supply source through the gas supply pipe 310b provided with an MFC 320b and a valve 330b and the nozzle 304b. For example, a halosilane-based gas containing silicon (Si) as the predetermined element and a halogen element may be supplied into the process chamber 201 as the source gas. The source gas refers to a thermally decomposable source gas and a source in a gaseous state. For example, the source gas may refer to the source in the gaseous state under a normal temperature and a normal pressure (atmospheric pressure) or a gas obtained by vaporizing a source in a liquid state under the normal temperature and the normal pressure. Halosilane refers to silane containing a halogen group. That is, the halogen group includes a halogen element such as chlorine (Cl), fluorine (F), bromine (Br) and iodine (I). As the halosilane-based gas, for example, a source gas containing silicon (Si) and chlorine, that is, a chlorosilane-based gas may be used. The chlorosilane-based gas serves as a silicon source. As the chlorosilane-based gas, for example, hexachlorodisilane ($Si_2Cl_6$, abbreviated as HCDS) gas may be used.

A reactant whose chemical structure (molecular structure) is different from that of the source gas is supplied into the process chamber 201 from a gas supply source 360a serving as a first gas supply source through the gas supply pipe 310a provided with an MFC 320a and a valve 330a and the nozzle 304a. The reactant (also referred to as a "reactive gas") is more difficult to be thermally decomposed or to be activated than the source gas. For example, a hydrogen nitride-based gas, which is a nitriding gas serving as a nitrogen-containing gas, is supplied into the process chamber 201 as the reactant. The hydrogen nitride-based gas serves as a nitrogen (N) source. As the hydrogen nitride-based gas, for example, ammonia ($NH_3$) gas may be used. The reactant may also be supplied into the process chamber 201 from a gas supply source 360c serving as a third gas supply source through the gas supply pipe 310c provided with an MFC 320c and a valve 330c and the nozzle 304c.

An inert gas such as nitrogen gas ($N_2$ gas) is supplied into the process chamber 201 from a gas supply source 360d, a gas supply source 360e and a gas supply source 360f through gas supply pipes 310d through 310f provided with MFCs 320d through 320f and valves 330d through 330f, respectively, the gas supply pipes 310a through 310c and the nozzles 304a, 304b and 304c. The $N_2$ gas serves as a purge gas, a carrier gas or a dilution gas. In addition, the $N_2$ gas also serves as a control gas which controls a thickness distribution of the film formed on the surface of the wafer 200.

A first process gas supply system (also referred to as a "first gas supply system") serving as a reactant supply system is constituted mainly by the gas supply pipe 310a, the MFC 320a, the valve 330a and the nozzle 304a. The first process gas supply system may further include the gas supply source 360a. A second process gas supply system (also referred to as a "second gas supply system") serving as a source supply system is constituted mainly by the gas supply pipe 310b, the MFC 320b, the valve 330b and the nozzle 304b. The second process gas supply system may further include the gas supply source 360b. A third process gas supply system (also referred to as a "third gas supply system") serving as a reactant supply system is constituted mainly by the gas supply pipe 310c, the MFC 320c, the valve 330c and the nozzle 304c. The third process gas supply system may further include the gas supply source 360c. An inert gas supply system is constituted mainly by the gas supply pipes 310a through 310f, the MFCs 320d through 320f, the valves 330d through 330f and the nozzles 304a, 304b and 304c. The inert gas supply system may further include the gas supply sources 360d through 360f.

The exhaust port 230 is provided below the gas exhaust area 224. An exhaust pipe 231 is connected to the exhaust port 230. A vacuum pump 246 serving as a vacuum exhauster is connected to the exhaust pipe 231 through a pressure sensor 245 and an APC (Automatic Pressure Controller) valve 244. The pressure sensor 245 serves as a pressure detector (pressure meter) to detect an inner pressure of the process chamber 201, and the APC valve 244 serves as a pressure controller (pressure regulator). The vacuum pump 246 is configured to vacuum-exhaust an inner atmosphere of the process chamber 201 such that the inner pressure of the process chamber 201 reaches a predetermined pressure (vacuum degree). The exhaust pipe 231 at a downstream side of the vacuum pump 246 is connected to a component such as a waste gas processing apparatus (not shown). The APC valve 244 serves as an opening/closing valve. With the vacuum pump 246 in operation, the APC valve 244 may be opened or closed to vacuum-exhaust the process chamber 201 or to stop the vacuum exhaust. With the vacuum pump 246 in operation, by adjusting an opening degree of the APC valve 244, the APC valve 244 is configured to adjust the inner pressure of the process chamber 201 by adjusting a conductance thereof. An exhaust system serving as an exhaust structure is constituted mainly by the exhaust pipe 231, the APC valve 244 and the pressure sensor 245. The exhaust system may further include the vacuum pump 246.

A temperature sensor (not shown) serving as a temperature detector is provided in the reaction tube 203. The electrical power supplied to the heater 207 is adjusted based on temperature information detected by the temperature sensor such that a desired temperature distribution of an inner temperature of the process chamber 201 is obtained.

Figure 3:
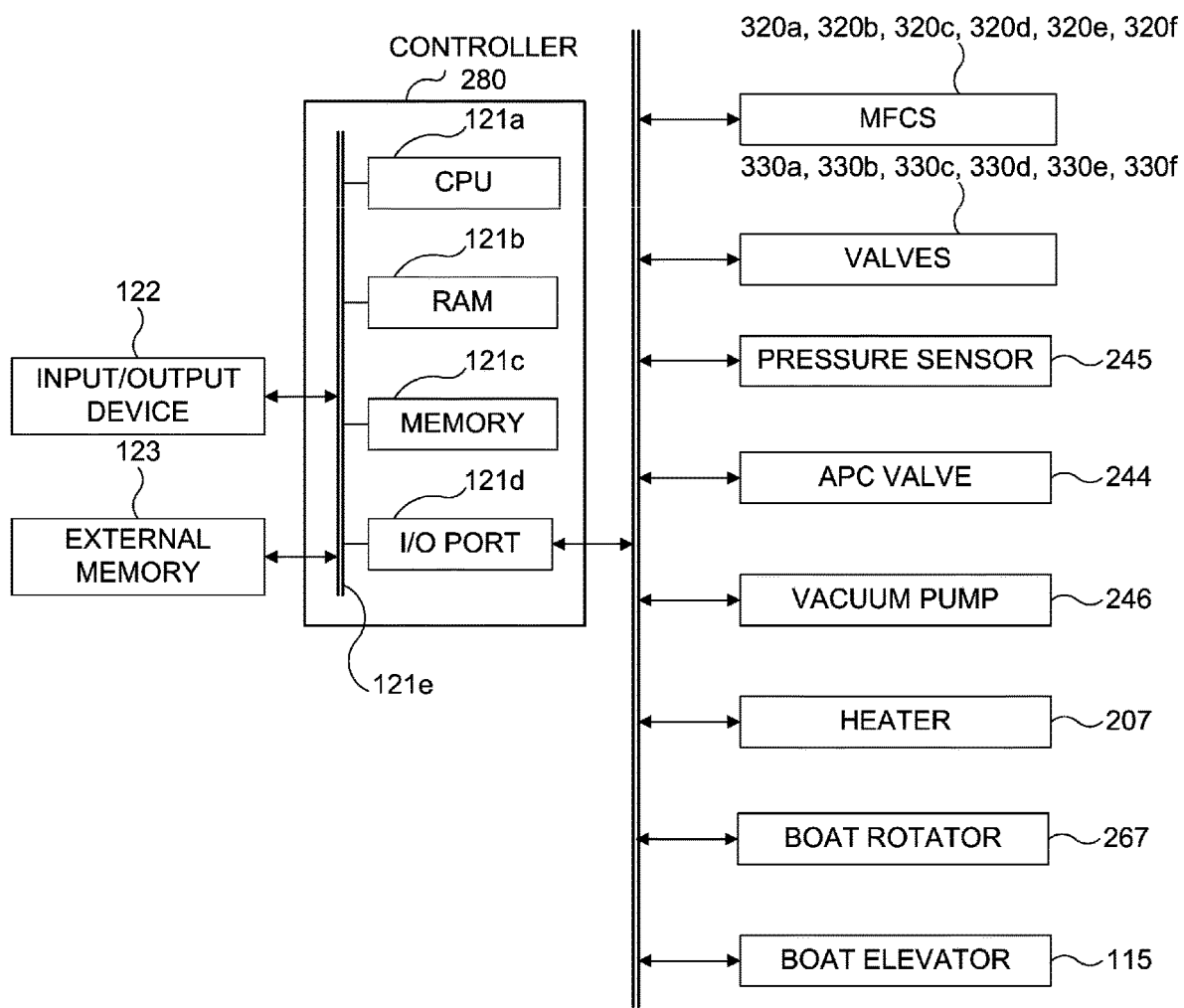
FIG. 3 is a block diagram schematically illustrating a configuration of a controller and related components of the substrate processing apparatus preferably used in the embodiment described herein.

As shown in FIG. 3, a controller 280 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 such as a touch panel is connected to the controller 280.

For example, the memory 121c is configured by components such as a flash memory and HDD (Hard Disk Drive). A control program for controlling the operation of the substrate processing apparatus or a process recipe containing information on the sequences and conditions of a substrate processing described later is readably stored in the memory 121c. The process recipe is obtained by combining steps of the substrate processing described later such that the controller 280 can execute the steps to acquire a predetermine result, and functions as a program. Hereinafter, the process recipe and the control program are individually or collectively referred to as a "program". The process recipe may also be referred to as a recipe. In the present specification, the term "program" may indicate only the process recipe, may indicate only the control program, or may indicate both of the process recipe and the control program. The RAM 121b functions as a memory area (work area) where a program or data read by the CPU 121a is temporarily stored.

The I/O port 121d is connected to the above-described components such as the MFCs 320a through 320f, the valves 330a through 330f, the pressure sensor 245, the APC valve 244, the vacuum pump 246, the heater 207, the boat rotator 267 and the boat elevator 115.

The CPU 121a is configured to read the control program from the memory 121c and execute the control program. In addition, the CPU 121a is configured to read the process recipe from the memory 121c according to an instruction such as an operation command inputted from the input/output device 122. According to the contents of the process recipe read from the memory 121c, the CPU 121a may be configured to control various operations such as flow rate adjusting operations for various gases by the FCs 320a through 320f, opening/closing operations of the valves 330a through 330f, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor (not shown), an operation of adjusting rotation and rotation speed of the boat 217 by the boat rotator 267 and an elevating and lowering operation of the boat 217 by the boat elevator 115.

The controller 280 may be embodied by installing the above-described program stored in an external memory 123 into a computer. For example, the external memory 123 may include a magnetic disk such as a hard disk drive (HDD), an optical disk such as a CD, a magneto-optical disk such as an MO, a semiconductor memory such as a USB memory. The memory 121c or the external memory 123 may be embodied by a non-transitory computer readable recording medium. Hereafter, the memory 121c and the external memory 123 are individually or collectively referred to as recording media. In the present specification, the term "recording media" may indicate only the memory 121c, may indicate only the external memory 123, and may indicate both of the memory 121c and the external memory 123. Instead of the external memory 123, a communication means such as the Internet and a dedicated line may be used for providing the program to the computer.

In the process furnace 202 described above, in a state where the plurality of the wafers including the wafer 200 to be batch-processed are stacked in the boat 217 in a multi-stage manner, the boat 217 is accommodated in the process chamber 201 while being supported by the boat support 218, and the gases are supplied to the plurality of the wafers including the wafer 200 accommodated in the process chamber 201 through the nozzles 304a, 304b and 304c.

In recent years, the semiconductor device is three-dimensionalized in order to increase the degree of integration thereof, so that a surface area of a wafer on which a semiconductor film is formed increases. As the surface area of the wafer increases, the consumption of a film-forming gas such as the process gas increases, and a uniformity of the semiconductor film deposited on the wafer may deteriorate.

In general, in the vertical type process furnace of the substrate processing apparatus serving as an example of the semiconductor manufacturing apparatus, a plurality of dummy wafers are loaded on an upper portion and a lower portion of the boat 217 accommodating (holding) the plurality of the wafers including the wafer 200 in order to uniformize the temperature of each of the plurality of the wafers arranged in a height direction (vertical direction). Thereby, the film to be grown may be uniformized. However, since a dummy wafer is usually a flat wafer, a surface area of the dummy wafer is different from a surface area of a product wafer on which a pattern is formed. Recently, the surface area of the product wafer may be 50 times or 100 times that of the flat wafer, and the surface area of the product wafer is increasing year by year. However, as the surface area increases, an amount of the consumption of the film-forming gas tends to increase. That is, an amount of the source gas consumed by the dummy wafer and the product wafer is different between a dummy wafer support region (which is a region where the plurality of the dummy wafers are loaded) and a product wafer support region (which is a region where a plurality of product wafers are loaded). Therefore, when the same amount of the source gas is supplied to the plurality of the wafers stacked in the height direction, the source gas is surplus in some location and the source gas is insufficient in other location. Due to the difference in a concentration of the source gas among the plurality of the wafers, it becomes difficult to uniformize the film among the plurality of the wafers.

According to the present embodiment, to cope with the problems such as the deterioration of the uniformity of the film quality and the film thickness due to the increase in the surface area of the product wafer, it is possible to improve the uniformity of the film on the surface of the product wafer and the uniformity of the film among the plurality of the product wafers.

According to the present embodiment, the three nozzles 304a, 304b and 304c are provided in the gas supply area 222, and are configured to supply two or more types of gas into the process chamber 201. The process chamber 201 is of a cylindrical shape. An inner diameter of the process chamber 201 is 104% to 108% of a maximum diameter of the wafer 200 that can be accommodated in the process chamber 201. The nozzles 304a, 304b and 304c are accommodated in the gas supply area 222 formed by protruding a part of the process chamber 201 outward while separated (isolated) from one another. Configurations of the nozzles 304a, 304b and 304c configured to supply the two or more types of the gas into the process chamber 201 will be described with reference to FIGS. 4A and 4B. The nozzle 304a, the nozzle 304b, and the nozzle 304c are used as a first gas supplier, a second gas supplier and a third gas supplier, respectively.

FIG. 4A schematically illustrates a horizontal cross-section of the nozzles 304a, 304b and 304c and periphery thereof in the product wafer support region where the plurality of the product wafers including a product wafer 200a (also simply referred to as "product wafers 200a") in the gas supply area 222 is accommodated (held), and FIG. 4B schematically illustrates a positional relationship between the nozzles 304a, 304b and 304c and the plurality of the wafers including the wafer 200 accommodated (stacked) in the boat 217 in a multistage manner.

The boat 217 includes: the product wafer support region where the product wafers 200a are accommodated (supported) at regular intervals; an upper dummy wafer support region provided above the product wafer support region and capable of supporting the plurality of the dummy wafers including a dummy wafer 200b (also simply referred to as "dummy wafers 200b"); and a lower dummy wafer support region provided below the product wafer support region and capable of supporting dummy wafers 200b. According to the present embodiment, the product wafer 200a refers to a product wafer with a pattern formed thereon, and the dummy wafer 200b refers to a flat bare wafer with no pattern formed thereon, or refers to a wafer whose surface area is between that of the product wafer 200a and that of the bare wafer. That is, one or more dummy wafers are stacked and supported above and below the product wafers 200a, respectively. One or more monitor wafers (for example, three monitor wafers) may be supported in the product wafer support region among the product wafers 200a. The number of the product wafers supported in the product wafer support region may be set to an integral multiple of the number (for example, 25) of wafers that can be accommodated in a wafer carrier such as a FOUP.

The nozzles 304a, 304b and 304c are provided in the gas supply area 222 from a lower portion toward an upper portion along the longitudinal direction of the gas supply area 222 (vertical direction). That is, each of the nozzles 304a, 304b and 304c extends in the vertical direction along the boat 217 accommodated in the process chamber 201, and is configured as a long nozzle of a straight tube (straight pipe) shape.

In addition, the nozzles 304a, 304b and 304c are arranged in the gas supply area 222 in the vicinity of an outer periphery of the process chamber 201 sequentially in the order of the nozzle 304a, the nozzle 304b, and the nozzle 304c. That is, the nozzle 304a and the nozzle 304c configured to supply the inert gas or the nitriding gas are arranged on both sides of the nozzle 304b configured to supply the source gas. That is, the nozzle 304b configured to supply the source gas is arranged in the center, and the nozzle 304a and the nozzle 304c configured to supply the inert gas or the nitriding gas are arranged such that the nozzle 304b is interposed between the nozzle 304a and the nozzle 304c.

The nozzle 304a is connected to the gas supply pipe 310a such that a fluid can flow from the gas supply sources 360a and 360d to a lower end of the nozzle 304a through the gas supply pipe 310a.

The nozzle 304b is connected to the gas supply pipe 310b such that a fluid can flow from the gas supply sources 360b and 360e to a lower end of the nozzle 304b through the gas supply pipe 310b.

The nozzle 304c is connected to the gas supply pipe 310c such that a fluid can flow from the gas supply sources 360c and 360f to a lower end of the nozzle 304c through the gas supply pipe 310c.

A plurality of gas supply holes (also simply referred to as "gas supply holes") 232a and a plurality of gas supply holes (also simply referred to as "gas supply holes") 232c configured to supply the gas are provided on side surfaces of the nozzle 304a and the nozzle 304c, respectively. Each of the gas supply holes 232a and the gas supply holes 232c is a small circular hole of a pinhole shape. For example, each of the gas supply holes 232a and the gas supply holes 232c is constituted by a plurality of openings or a plurality of vertically elongated slits. An upper end of an uppermost gas supply hole among the gas supply holes 232a of the nozzle 304a and an upper end of an uppermost gas supply hole among the gas supply holes 232c of the nozzle 304c are arranged corresponding to an uppermost dummy wafer among the dummy wafers 200b supported in the upper dummy wafer support region. In addition, a lower end of a lowermost gas supply hole among the gas supply holes 232a of the nozzle 304a and a lower end of a lowermost gas supply hole among the gas supply holes 232c of the nozzle 304c are arranged corresponding to a lowermost dummy wafer among the dummy wafers 200b supported in the lower dummy wafer support region. That is, in the nozzle 304a and the nozzle 304c, the gas supply holes 232a and the gas supply holes 232c are provided in the upper dummy wafer support region, the product wafer support region and the lower dummy wafer support region. Preferably, the gas supply holes 232a and the gas supply holes 232c are provided at predetermined intervals so as to correspond to the surfaces (upper surfaces) of the plurality of the wafers including the dummy wafer 200b or correspond to the openings of the gas supply slits 235.

A plurality of gas supply holes (also simply referred to as "gas supply holes") 232b serving as a gas supply port configured to supply the gas are provided on a side surface of the nozzle 304b. An upper end of an uppermost gas supply hole among the gas supply holes 232b of the nozzle 304b is arranged lower than a lowermost dummy wafer among the dummy wafers 200b supported in the upper dummy wafer support region. In addition, a lower end of a lowermost gas supply hole among the gas supply holes 232b of the nozzle 304b is arranged higher than an uppermost dummy wafer among the dummy wafers 200b supported in the lower dummy wafer support region. That is, on the side surface of the nozzle 304b, the gas supply holes 232b are provided in the product wafer support region, but are not provided in the upper dummy wafer support region and the lower dummy wafer support region. The number of the gas supply holes 232b is equal to the number of the product wafers 200a, and the gas supply holes 232b are configured to discharge (eject) the source gas toward each surface (upper surface) of the product wafers.

The gas supply holes 232a, the gas supply holes 232b and the gas supply holes 232c are opened so as to face a center of the reaction tube 203.

(2) Substrate Processing

Hereinafter, an exemplary sequence (film-forming sequence) of the substrate processing (film-forming process) of forming a film on the wafer 200 serving as a substrate, which is a part of manufacturing processes of a semiconductor device, will be described. The exemplary sequence is performed by using the above-described substrate processing apparatus. Hereinafter, the operations of the components of the substrate processing apparatus are controlled by the controller 280.

The substrate processing will be described by way of an example in which a silicon nitride film (Si3N4 film) is formed on the product wafer 200a serving as the wafer 200 by supplying the silicon source gas (source gas) and the nitriding gas in accordance with the following film-forming sequence with reference to FIG. 13. For example, a pattern whose surface area is large and at which a concave-convex structure is formed is provided on a surface of the product wafer 200a. The boat 217 may also be loaded with the dummy wafers 200b as shown in FIG. 4, and the dummy wafer 200b may be processed together with the product wafer 200a. However, hereinafter, the description of the wafer 200 mainly refers to the product wafer 200a.

In the present specification, the term "wafer" may refer to "a wafer itself" or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself" or may refer to "a surface of a predetermined layer or a film formed on a wafer". Thus, in the present specification, "forming a predetermined layer (or film) on a wafer" may refer to "forming a predetermined layer (or film) on a surface of a wafer itself" or may refer to "forming a predetermined layer (or film) on a surface of another layer or another film formed on a wafer". In the present specification, the term "substrate" and "wafer" may be used as substantially the same meaning. That is, the term "substrate" may be substituted by "wafer" and vice versa.

Wafer Charging and Boat Loading Step S901

The plurality of the wafers including the wafer 200 are charged (transferred) into the boat 217 (wafer charging step). After the boat 217 is charged with the plurality of the wafers, the lower end opening of the manifold 226 is opened. Then, as shown in FIG. 1, the boat 217 charged with the plurality of the wafers is elevated by the boat elevator 115 and loaded (transferred) into the process chamber 201 (boat loading step). With the boat 217 loaded, the seal cap 219 seals the lower end opening of the manifold 226 via the O-ring 220b.

Pressure Adjusting Step S902

The vacuum pump 246 vacuum-exhausts the inner atmosphere of the process chamber 201 until the inner pressure of the process chamber 201 in which the plurality of the wafers including the wafer 200 are accommodated reaches a desired pressure (vacuum degree). In the pressure adjusting step S902, the inner pressure of the process chamber 201 is measured by the pressure sensor 245, and the APC valve 244 is feedback-controlled based on measured pressure information.

Temperature Adjusting Step S903

The heater 207 heats the process chamber 201 until the temperature of the wafer 200 in the process chamber 201 reaches a desired film-forming temperature. The state of electric conduction to the heater 207 is feedback-controlled based on the temperature information detected by a temperature sensor 263 such that the desired temperature distribution of the inner temperature of the process chamber 201 is obtained. The boat rotator 267 rotates the plurality of the wafers including the wafer 200 by rotating the boat 217. The vacuum pump 246 continuously vacuum-exhausts the inner atmosphere of the process chamber 201, the heater continuously heats the process chamber 201 and the boat rotator 267 continuously rotates the plurality of the wafers until at least the processing of the wafer 200 is completed.

Film-forming Step S904

Thereafter, the film-forming step S904 is performed by performing a step (A) and a step (B) sequentially.

Step (A)

Figure 13:
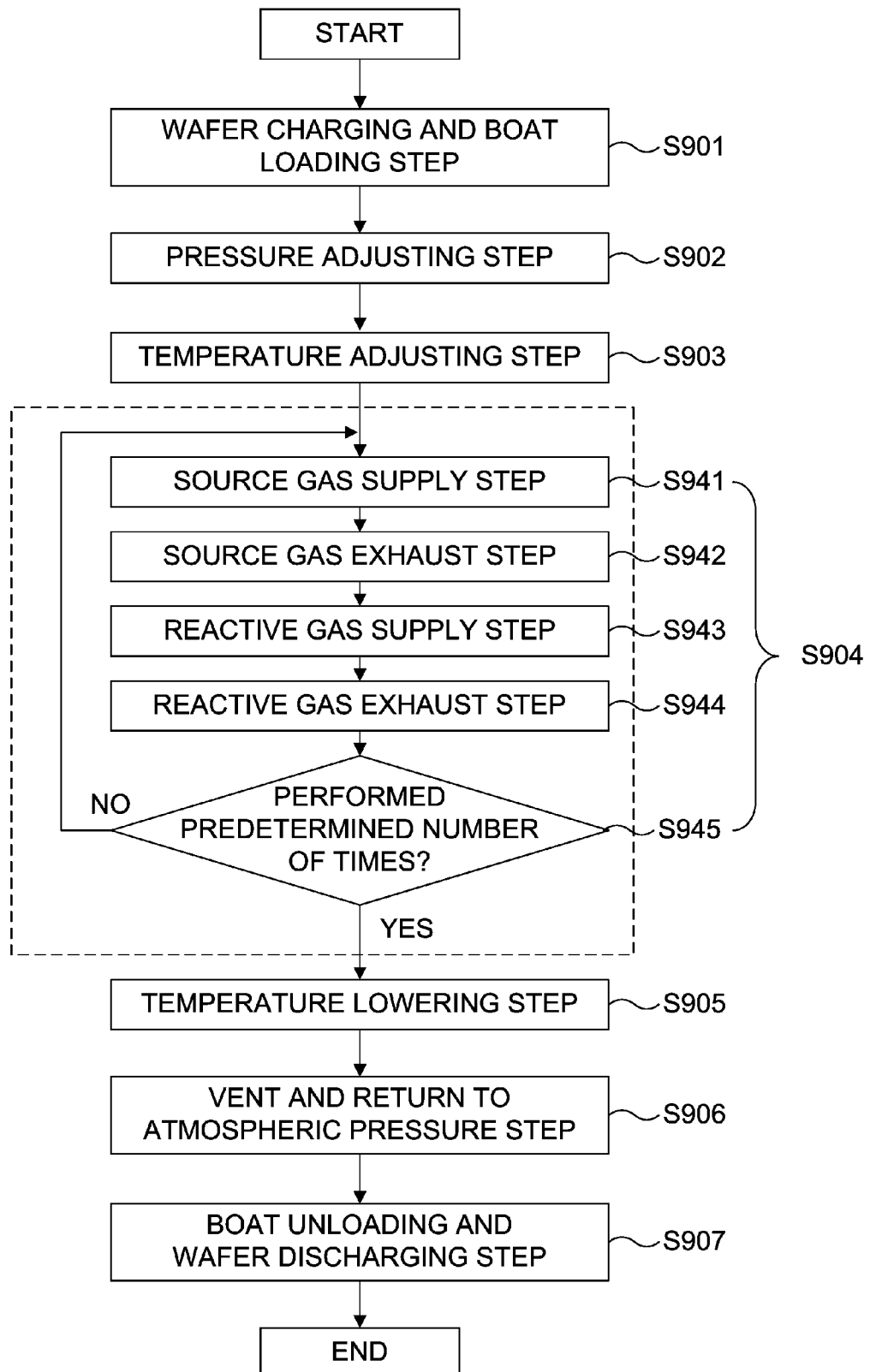
FIG. 13 is a flow chart schematically illustrating a substrate processing of forming the film on the substrate using the substrate processing apparatus preferably used in the embodiment described herein.

In the step (A), as a sub-step (source gas supply step) S941 shown in FIG. 13, the HCDS gas is supplied to the wafer 200 in the process chamber 201. Specifically, the valve 330b is opened to supply the HCDS gas into the gas supply pipe 310b. A flow rate of the HCDS gas supplied into the gas supply pipe 310b is adjusted by the MFC 320b. The HCDS gas whose flow rate is adjusted is then supplied into the process chamber 201 through the nozzle 304b, and is exhausted through the exhaust port 230. In the step (A), the $N_2$ gas serving as the inert gas is supplied to the wafer 200 in the process chamber 201 through the nozzles 304a and 304c on both sides of the nozzle 304b. Specifically, the valves 330d and 330f are opened to supply the $N_2$ gas into the gas supply pipes 310a and 310c. A flow rate of the $N_2$ gas is adjusted by the MFCs 320d and 320f, the $N_2$ gas whose flow rate is adjusted is supplied into the process chamber 201 through the nozzles 304a and 304c, and is exhausted through the exhaust port 230. That is, in the step (A), the HCDS gas and the $N_2$ gas are supplied to the wafer 200.

For example, process conditions in the step (A) are exemplified as follows:
  Supply flow rate of the HCDS gas: 0.001 slm (Standard Liters Per Minute) to 2 slm, preferably, 0.01 slm to 1 slm;
  Supply flow rate of the $N_2$ gas (per gas supply pipe): 0.5 slm to 5 slm;
  Gas supply time (a time duration of supplying the HCDS gas and the N2 gas): 0.1 second to 120 seconds, preferably, 1 second to 60 seconds;
  Process temperature: 250° C. to 800° C., preferably, 400° C. to 700° C.; and
  Process pressure: 1 Pa to 2,666 Pa, preferably, 67 Pa to 1,333 Pa.

By supplying the HCDS gas and the $N_2$ gas to the wafer 200 under the above-described process conditions, for example, a silicon-containing layer containing chlorine (Cl) is formed as a first layer on an outermost surface of the wafer 200.

After the first layer is formed on the wafer 200, as a sub-step (source gas exhaust step) S942 shown in FIG. 13, the valve 330b is closed to stop the supply of the HCDS gas into the process chamber 201. Then, the inner atmosphere of the process chamber 201 is vacuum-exhausted to remove the substances such as the gas remaining in the process chamber 201. When the inner atmosphere of the process chamber 201 is vacuum-exhausted, with the valves 330d through 330f open, the $N_2$ gas is supplied into the process chamber 201 through the nozzles 304a, 304b and 304c. The $N_2$ gas supplied through the nozzles 304a, 304b and 304c serves as the purge gas. As a result, the inner atmosphere of the process chamber 201 is purged. In the sub-step S942, for example, each flow rate of the $N_2$ gas supplied through each of the nozzles 304a, 304b and 304c is set within a range from 0.1 slm to 2 slm. The other process conditions are the same as the process conditions in the sub-step S941 of the step (A) described above.

Instead of the HCDS gas, a chlorosilane source gas such as monochlorosilane ($SiH_3Cl$, abbreviated as MCS) gas, dichlorosilane ($SiH_2Cl_2$, abbreviated as DCS) gas, trichlorosilane ($SiHCl_3$, abbreviated as TCS) gas, tetrachlorosilane ($SiCl_4$, abbreviated as STC) gas, and octachlorotrisilane ($Si_3Cl_8$, abbreviated as OCTS) may be used as the source gas.

Instead of the $N_2$ gas, for example, a rare gas such as argon (Ar) gas, helium (He) gas, neon (Ne) gas and xenon (Xe) gas may be used as the inert gas. The same also applies to the step (B) described later.

Step (B)

After the step (A) is completed, as a sub-step (reactive gas supply step) S943 shown in FIG. 13, the $NH_3$ gas is supplied to the wafer 200 in process chamber 201, that is, to the first layer formed on the wafer 200. Specifically, the valves 330a and 330c are opened to supply the $NH_3$ gas into the gas supply pipes 310a and 310c. A flow rate of the $NH_3$ gas supplied into each of the gas supply pipes 310a and 310c is adjusted by the MFCs 320a and 320c. The $NH_3$ gas whose flow rate is adjusted is then supplied into the process chamber 201 through the nozzles 304a and 304c, and is exhausted through the exhaust port 230. Thereby, the $NH_3$ gas is supplied to the wafer 200. In the sub-step S943 of the step (B), by opening at least one among the valves 330d through 330f, the $N_2$ gas may be supplied into the process chamber 201 through at least one among the nozzles 304a, 304b and 304c.

For example, the process conditions in the step (B) are exemplified as follows:
  Supply flow rate of the $NH_3$ gas: 1 slm to 10 slm;
  $NH_3$ gas supply time (a time duration of supplying the $NH_3$ gas): 0.1 second to 120 seconds, preferably, 1 second to 60 seconds;
  Supply flow rate of the $N_2$ gas (per gas supply pipe): 0 slm to 2 slm; and
  Process pressure: 1 Pa to 4,000 Pa, preferably, 1 Pa to 3,000 Pa.

The other process conditions are the same as the process conditions in the sub-step S941 of the step (A) described above.

By supplying the $NH_3$ gas to the wafer 200 under the above-described process conditions, at least a part of the first layer formed on the wafer 200 is nitrided (modified). By modifying the first layer, a second layer containing silicon and nitrogen, that is, an SiN layer is formed on the wafer 200. When the second layer is formed, impurities such as chlorine contained in the first layer may form a gas phase substance containing at least chlorine during a modifying reaction of the first layer by the $NH_3$ gas, and the gas phase substance is discharged from the process chamber 201. As a result, the second layer becomes a layer which contains a smaller amount of the impurities such as chlorine than the first layer.

After the second layer is formed, as a sub-step (reactive gas exhaust step) S944 shown in FIG. 13, the valves 330a and 330c are closed to stop the supply of the $NH_3$ gas into the process chamber 201. Then, the inner atmosphere of the process chamber 201 is vacuum-exhausted to remove the substances such as the gas remaining in the process chamber 201 according to the same process sequence and process conditions as those of the sub-step S942 of the step (A).

Instead of the $NH_3$ gas, for example, a hydrogen nitride-based gas such as diazene ($N_2H_2$) gas, hydrazine ($N_2H_4$) gas and $N_3H_8$ gas may be used as the reactant.

Performing a Predetermined Number of Times

By performing a cycle wherein the step (A) and the step (B) are performed non-simultaneously in this order a predetermined number (n, n is an integer equal to or greater than 1) of times, as a sub-step S945 shown in FIG. 13, an SiN film of a predetermined composition and a predetermined thickness is formed on the wafer 200. It is preferable that the cycle is performed a plurality of times. That is, the cycle is performed (repeated) until a total thickness of the SiN film formed by stacking the second layer by performing the cycle a plurality of times reaches the desired thickness under the condition that the second layer formed in each cycle is thinner than the desired thickness. In the present specification, the exemplary sequence of the film-forming process described above may be represented as follows:

(HCDS→NH$_3$)×$n$=>SiN

In the following descriptions, the same also applies to other examples.

Temperature Lowering Step S905 and Returning to Atmospheric Pressure Step S906

After the film-forming step S904 is completed, a temperature adjusting operation continued from the step S903 is also completed, and the temperature of the wafer 200 in the process chamber 201 may be lowered (temperature lowering step S905). In addition, while lowering the temperature of the wafer 200, the N$_2$ gas serving as the purge gas is supplied into the process chamber 201 through each of the nozzles 304a, 304b and 304c, and then the N$_2$ gas supplied into the process chamber 201 is exhausted through the exhaust port 230. Thereby, the inner atmosphere of the process chamber 201 is purged with the N$_2$ gas, thus the gas remaining in the process chamber 201 or reaction by-products remaining in the process chamber 201 are removed from the process chamber 201 (after-purge). Thereafter, the inner atmosphere of the process chamber 201 is replaced with the inert gas, and the inner pressure of the process chamber 201 is returned to the atmospheric pressure.

Boat Unloading and Wafer Discharging Step S907

Thereafter, the seal cap 219 is lowered by the boat elevator 115 and the lower end opening of the manifold 226 is opened. The boat 217 with the plurality of processed wafers including the wafer 200 charged therein is unloaded out of the reaction tube 203 through the lower end opening of the manifold 226 (boat unloading). After the boat 217 is unloaded, the lower end opening of the manifold 226 is sealed by a shutter (not shown) through a seal such as an O-ring (shutter closing). Then, the plurality of the processed wafers including the wafer 200 are discharged from the boat 217 (wafer discharging).

(3) Modified Examples

Subsequently, modified examples of the present embodiment will be described with reference to FIGS. 5 through 7 and 14. These modified examples may be arbitrarily combined. In addition, unless otherwise described, configurations of the modified examples are similar to the configuration of the embodiment described above.

First Modified Example

Figure 5A:
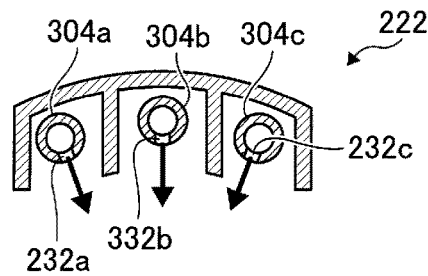
FIG. 5A schematically illustrates a horizontal cross-section of nozzles and periphery thereof according to a first modified example described herein, and FIG. 5B schematically illustrates a positional relationship between the nozzles according to the first modified example described herein and the substrate accommodated in the substrate retainer.
Figure 5B:
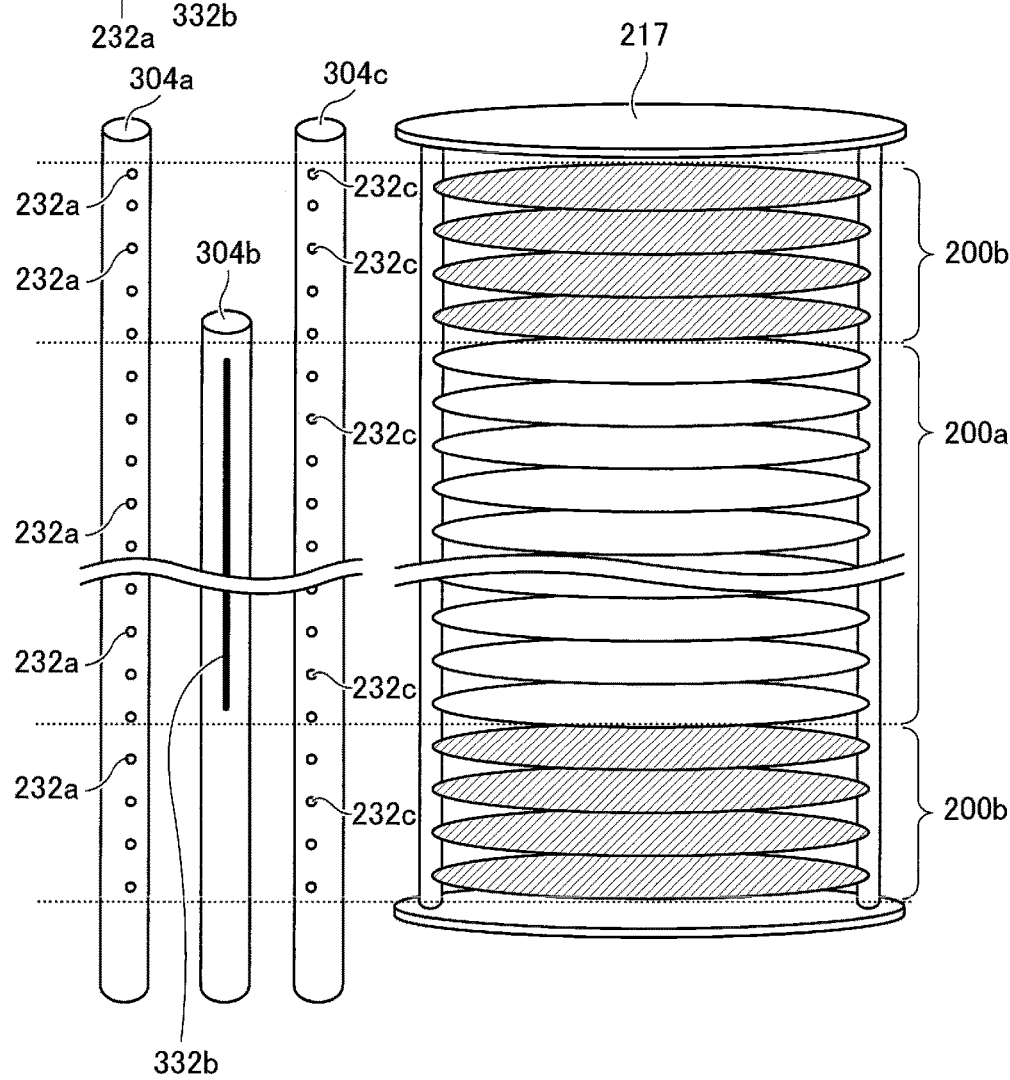

As shown in FIG. 5, according to the present modified example, the three nozzles 304a, 304b and 304c are provided in the gas supply area 222, and are configured to supply the two or more types of the gas into the process chamber 201. However, a shape of a gas supply port of the nozzle 304b configured to supply the source gas according to the present modified example is different from that of the nozzle 304b according to the embodiment described above.

A vertically elongated slit-shaped opening 332b serving as the gas supply port configured to supply the gas is provided on the side surface of the nozzle 304b. An upper end of the opening 332b of the nozzle 304b is arranged lower than the lowermost dummy wafer among the dummy wafers 200b supported in the upper dummy wafer support region. In addition, a lower end of the opening 332b of the nozzle 304b is arranged higher than the uppermost dummy wafer among the dummy wafers 200b supported in the lower dummy wafer support region. That is, in the nozzle 304b, the opening 332b is provided in the product wafer support region, but is not provided in the upper dummy wafer support region and the lower dummy wafer support region. With such a configuration, when the source gas is supplied in the step (A) of the film-forming step described above, the source gas is supplied to the wafer 200 in the process chamber 201 through the opening 332b of the nozzle 304b and the inert gas is supplied through the gas supply holes 232a and the gas supply holes 232c of the nozzles 304a and 304c arranged on both sides of the nozzle 304b.

Second Modified Example

Figure 6A:
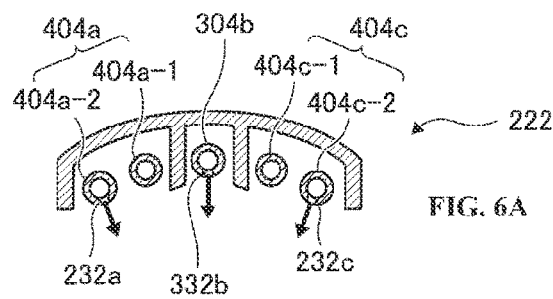
FIG. 6A schematically illustrates a horizontal cross-section of nozzles and periphery thereof according to a second modified example described herein, and FIG. 6B schematically illustrates a positional relationship between the nozzles according to the second modified example described herein and the substrate accommodated in the substrate retainer.
Figure 6B:
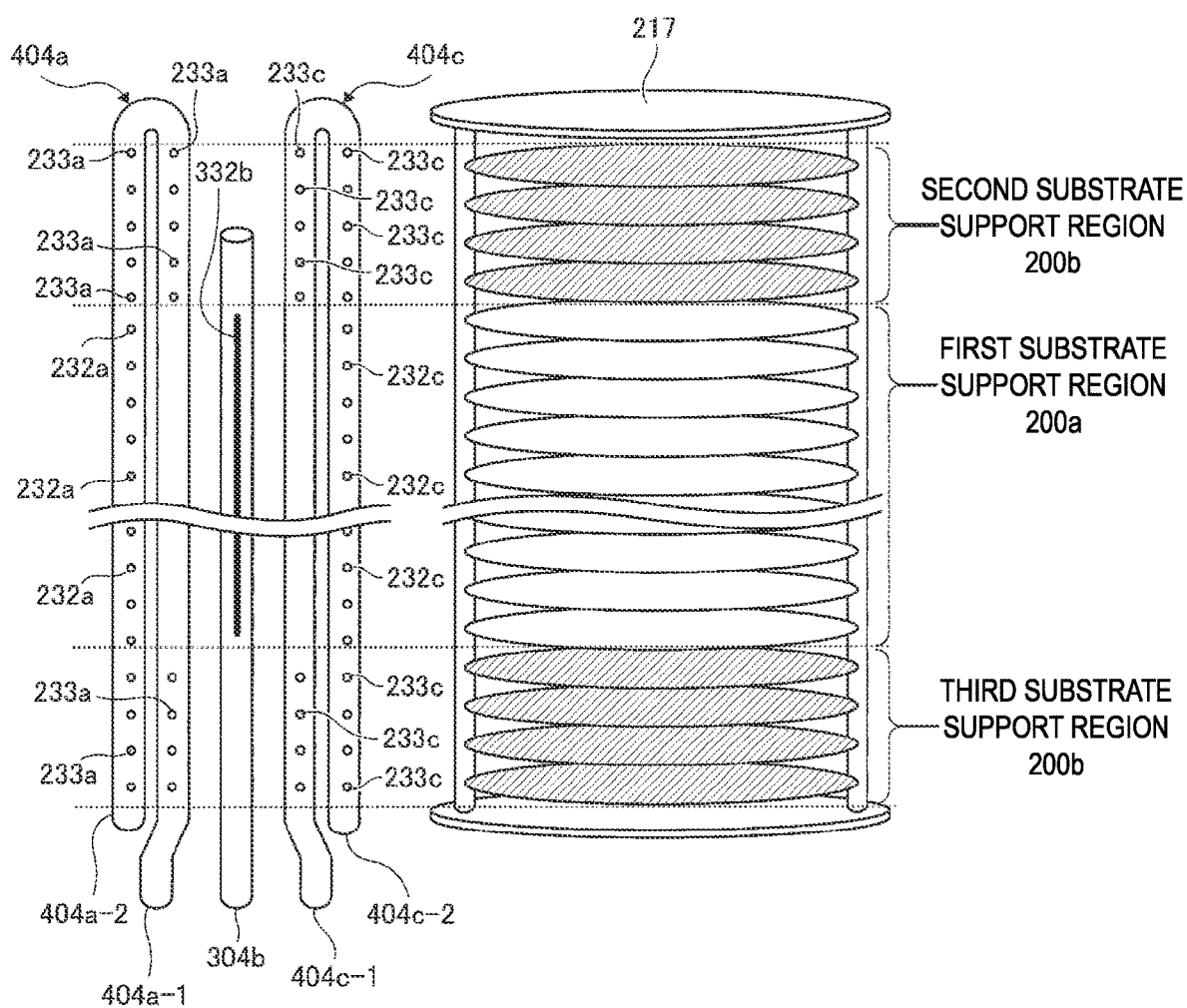

As shown in FIG. 6, according to the present modified example, three nozzles 404a, 304b and 404c are provided in the gas supply area 222, and are configured to supply the two or more types of the gas into the process chamber 201. However, shapes of the nozzle 404a and the nozzle 404c arranged on both sides of the nozzle 304b configured to supply the source gas according to the present modified example are different from those of the nozzle 304a and the nozzle 304c according to the first modified example described above.

The nozzles 404a, 304b and 404c are provided in the gas supply area 222 from the lower portion toward the upper portion along the longitudinal direction of the gas supply area 222 (vertical direction). The nozzle 304b extends in the vertical direction along the boat 217 accommodated in the process chamber 201, and is configured as an I-shaped long nozzle of a tube shape. Each of the nozzle 404a and the nozzle 404c is a multi-hole nozzle (porous nozzle), extends in the vertical direction along the boat 217 accommodated in the process chamber 201, and is configured as a U-shaped long nozzle of a tube shape.

The nozzle 404a is constituted by: an ascending pipe 404a-1 connected to the gas supply pipe 310a such that the fluid can flow from the gas supply sources 360a and 360d to a lower end of the ascending pipe 404a-1 through the gas supply pipe 310a; and a descending pipe 404a-2 connected to an upper end of the ascending pipe 404a-1 such that the fluid can flow and provided substantially parallel to the ascending pipe 404a-1.

The nozzle 304b is connected to the gas supply pipe 310b such that the fluid can flow from the gas supply sources 360b and 360e to the lower end of the nozzle 304b through the gas supply pipe 310b.

The nozzle 404c is constituted by: an ascending pipe 404c-1 connected to the gas supply pipe 310c such that the fluid can flow from the gas supply sources 360c and 360f to a lower end of the ascending pipe 404c-1 through the gas supply pipe 310c; and a descending pipe 404c-2 connected to an upper end of the ascending pipe 404c-1 such that the fluid can flow and provided substantially parallel to the ascending pipe 404c-1.

The gas supply holes 232a and the gas supply holes 232c are provided in the product wafer support region of the descending pipes 404a-2 and 404c-2 on side surfaces of the nozzles 304a and 304c, respectively. A plurality of gas supply holes (also simply referred to as "gas supply holes") 233a and a plurality of gas supply holes (also simply referred to as "gas supply holes") 233c are provided in the upper dummy wafer support region and the lower dummy wafer support region of the ascending pipes 404a-1 and 404c-1 and in the upper dummy wafer support region and the lower dummy wafer support region of the descending pipes 404a-2 and 404c-2, respectively. The gas supply holes 232a, the gas supply holes 232c, the gas supply holes 233a and the gas supply holes 233c are continuously arranged at the same pitch as the distance between the plurality of the wafers including the wafer 200. An opening area of a gas supply hole among the gas supply holes 233a and 233c may be set greater than an opening area of a gas supply hole of the gas supply holes 232a and 232c. That is, the number of the gas supply holes such as the gas supply holes 233a and the gas supply holes 233c in the dummy wafer region (that is, the upper dummy wafer support region and the lower dummy wafer support region) of the nozzles 404a and 404c configured to supply the inert gas may be more than the number of the gas supply holes such as the gas supply holes 232a and the gas supply holes 232c of the nozzles 304a and 304c in the embodiment and the first modified example described above. As a result, it is possible to further lower a concentration of the silicon source in the dummy wafer support region, and it is also possible to easily control the uniformity of the film thickness on the surface of the product wafer and the uniformity of the film thickness among the product wafers.

An upper end of an uppermost gas supply hole among the gas supply holes 233a of the nozzle 404a and an upper end of an uppermost gas supply hole among the gas supply holes 233c of the nozzle 404c are arranged corresponding to the uppermost dummy wafer among the dummy wafers 200b supported in the upper dummy wafer support region. In addition, a lower end of a lowermost gas supply hole among the gas supply holes 233a of the nozzle 404a and a lower end of a lowermost gas supply hole among the gas supply holes 233c of the nozzle 404c are arranged corresponding to the lowermost dummy wafer among the dummy wafers 200b supported in the lower dummy wafer support region. With such a configuration, when the source gas is supplied in the step (A) of the film-forming step described above, the source gas is supplied to the wafer 200 in the process chamber 201 through the opening 332b of the nozzle 304b and the inert gas is supplied through the gas supply holes 232a, the gas supply holes 232c, the gas supply holes 233a and the gas supply holes 233c of the nozzles 404a and 404c arranged on both sides of the nozzle 304b.

That is, the nozzles 404a and 404c are configured such that a substantial opening area which is obtained by averaging along the longitudinal direction the opening areas of the gas supply holes 233a and 233c arranged in the upper and the lower dummy wafer support region is greater than another substantial opening area which is obtained by averaging along the longitudinal direction the opening areas of the gas supply holes 232a and 232c arranged in the product wafer support region.

In addition, the nozzles 404a and 404c are configured such that an average opening width of each of the gas supply holes 232a and the gas supply holes 232c averaged in a nozzle longitudinal direction is 1% or less of a square root of a cross-sectional area of a flow path of each of the nozzles 404a and 404c. According to the present modified example, the average opening width averaged in the nozzle longitudinal direction may also refer to an opening width of a continuous slit in the longitudinal direction whose conductance is equal to a conductance per unit length in the longitudinal direction of the gas supply holes 232a or the gas supply holes 232c. In addition, the nozzle 304b is configured such that an opening width of the opening 332b of the nozzle 304b is 3% or more of a square root of a cross-sectional area of a flow path of the nozzle 304b. Instead of one continuous opening from the upper end thereof to the lower end thereof, the opening 332b may be configured as a plurality of slits extending intermittently in the vertical direction and bridged on both sides thereof in order to increase the strength thereof.

Third Modified Example

As shown in FIG. 7, according to the present modified example, the three nozzles 304a, 304b and 404c are provided in the gas supply area 222, and are configured to supply the two or more types of the gas into the process chamber 201. However, the shape of the nozzle 404c provided at the side of the nozzle 304b configured to supply the source gas according to the present modified example is different from that of the nozzle 304c according to the first modified example described above.

The nozzles 304a, 304b and 404c are provided in the gas supply area 222 from the lower portion toward the upper portion along the longitudinal direction of the gas supply area 222 (vertical direction). Each of the nozzles 304a and 304b extends in the vertical direction along the boat 217 accommodated in the process chamber 201, and is configured as an I-shaped long nozzle of a tube shape. The nozzle 404c extends in the vertical direction along the boat 217 accommodated in the process chamber 201, and is configured as a U-shaped long nozzle of a tube shape.

The nozzle 304a is connected to the gas supply pipe 310a such that the fluid can flow from the gas supply sources 360a and 360d to the lower end of the nozzle 304a through the gas supply pipe 310a.

The nozzle 304b is connected to the gas supply pipe 310b such that the fluid can flow from the gas supply sources 360b and 360e to the lower end of the nozzle 304b through the gas supply pipe 310b.

The nozzle 404c is constituted by: the ascending pipe 404c-1 connected to the gas supply pipe 310c such that the fluid can flow from the gas supply sources 360c and 360f to the lower end of the ascending pipe 404c-1 through the gas supply pipe 310c; and the descending pipe 404c-2 connected to the upper end of the ascending pipe 404c-1 such that the fluid can flow and provided substantially parallel to the ascending pipe 404c-1.

The gas supply holes 232c are provided in the product wafer support region, the upper dummy wafer support region and the lower dummy wafer support region on a side surface of the descending pipe 404c-2 of the nozzle 404c. The gas supply holes 232c are not provided in the ascending pipe 404c-1 of the nozzle 404c.

By supplying the inert gas (purge gas) using the U-shaped (return shape) nozzle 404c according to the present modified example, it is possible to improve the quality of the film formed on the wafer 200. For example, the purge gas ($N_2$ gas), which is effective in improving the thickness uniformity of the film, is often supplied at a large flow rate of 2 slm to 10 slm. The purge gas is supplied to wafers provided in the lower portion of the boat 217 among the plurality of the wafers through the I-shaped nozzle before the purge gas is sufficiently warmed up. As a result, a temperature of the purge gas may not be uniform from the lower portion to an upper portion of the boat 217. However, by using the U-shaped nozzle 404c, it is possible to sufficiently warm the purge gas before being supplied to the plurality of the wafers including the wafer 200. As the temperature of the purge gas increases, a diffusion rate of gas molecules also increases, and it is expected that it is possible to shorten an alternate supply interval of the source gas while maintaining the quality of the film. In addition, a temperature at which the $NH_3$ gas becomes a radical or a precursor is higher than a temperature at which the HCDS gas becomes a radical or a precursor. That is, it is demanded for the $NH_3$ gas to become the precursor at a predetermined temperature or higher, and it is preferable to maintain the $NH_3$ gas in the nozzle for a sufficient time when lowering the process temperature to the predetermined temperature. Preferably, by increasing a volume of the nozzle by using the U-shaped nozzle 404c, it is possible to apply the nozzle 404c to supply the reactive gas which is difficult to be decomposed.

Fourth Modified Example

Figure 14:
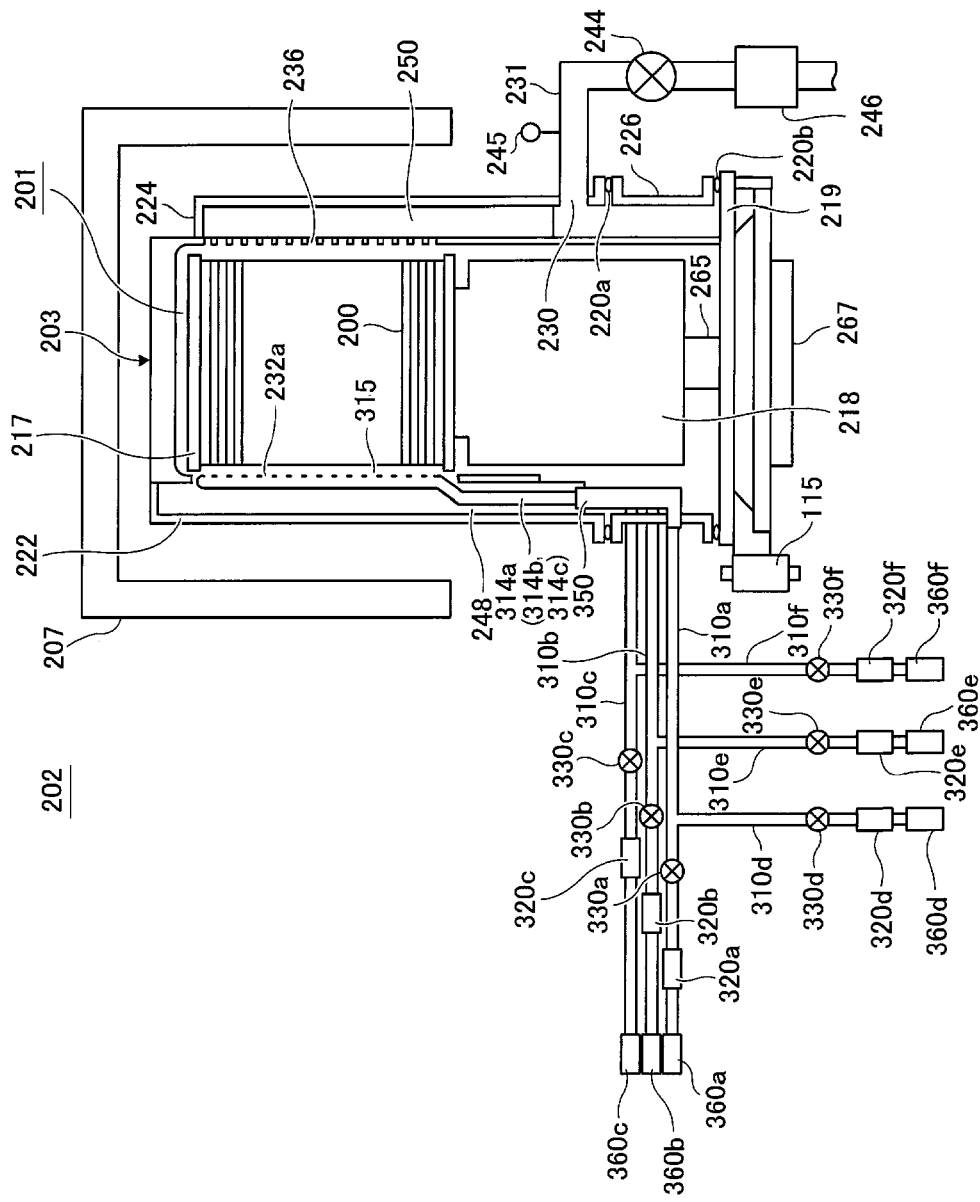
FIG. 14 schematically illustrates a vertical cross-section of a vertical type process furnace of a substrate processing apparatus according to a fourth modified example described herein.

As shown in FIG. 14, according to the present modified example, in comparison with FIG. 1, the nozzles 304a, 304b and 304c may be replaced with nozzles 314a, 314b and 314c, and the gas supply slits 235 may be replaced with a vertical gas supply slit 315. The vertical gas supply slit 315 is an opening that is provided for each region of the gas supply area 222, and is configured to allow each region of the gas supply area 222 to fluidically communicate with the process chamber 201. A width of the vertical gas supply slit 315 is substantially equal to a width of each region of the gas supply area 222 provided corresponding to the vertical gas supply slit 315. Positions of an upper end and a lower end of the opening (that is, the vertical gas supply slit 315) correspond to the upper end of the upper dummy wafer support region and the lower end of the lower dummy wafer support region, respectively. However, actually, the opening may be expanded to prevent the contact with the nozzles 314a, 314b and 314c. The nozzles 314a, 314b and 314c extend vertically upward from the lower portion of the gas supply area 222, then extend obliquely upward toward a tube axis of the reaction tube 203, and then extend vertically again when reaching the vertical gas supply slit 315. It is desirable that the nozzles 314a, 314b and 314c contact an inner peripheral surface of the reaction tube 203 without protruding from the vertical gas supply slit 315 toward an inner periphery of the reaction tube 203. When the nozzles 314a, 314b and 314c protrude toward the inner periphery of the reaction tube 203, the nozzles 314a, 314b and 314c may contact the boat 217 being rotated. The gas supply port such as the gas supply holes 232a, the gas supply holes 232c, the opening 332b, the gas supply holes 233a and the gas supply holes 233c may be provided at the nozzles 314a, 314b and 314c, accordingly. According to the fourth modified example, the gas is efficiently supplied to each of the plurality of the wafers by discharging the gas from positions closer to the plurality of the wafers. That is, a ratio of the gas discharged from a certain gas supply hole reaching a wafer other than the corresponding wafer is reduced. Therefore, it is possible to improve the uniformity of the film among the plurality of the substrates.

OTHER EMBODIMENTS

While the technique of the present disclosure is described by way of the above-described embodiment and the modified examples, the above-described technique is not limited thereto. The above-described technique may be modified in various ways without departing from the gist thereof.

For example, while the above-described embodiment and the modified examples are described by way of an example in which the nitriding gas such as the $NH_3$ gas is supplied through the two nozzles 304a and 304c, the above-described technique is not limited thereto. For example, the nitriding gas may be supplied through at least one among the nozzle 304a and the nozzle 304c.

For example, while the above-described embodiment and the modified examples are described by way of an example in which the gas supply holes 232b are provided only in the product wafer support region on the side surface of the nozzle 304b configured to supply the source gas, the above-described technique is not limited thereto. For example, the above-described technique may be preferably applied when the total opening area of the gas supply holes 232b or the opening 332b provided in the dummy wafer support region on the side surface of the nozzle 304b is smaller than the total opening area of the gas supply holes 232a and the gas supply holes 232c provided on the side surfaces of the nozzles 304a and 304c configured to supply the inert gas and arranged on both sides of the nozzle 304b.

For example, while the above-described embodiment and the modified examples are described by way of an example in which the gas supply holes 232b are provided only in the product wafer support region on the side surface of the nozzle 304b configured to supply the source gas, the above-described technique is not limited thereto. For example, the above-described technique may be preferably applied when the total opening area of the gas supply holes 232a and the gas supply holes 232c provided on the side surfaces of the nozzles 304a and 304c configured to supply the inert gas and arranged on both sides of the nozzle 304b is larger than the total opening area of the gas supply holes 232b or the opening 332b provided in the dummy wafer support region on the side surface of the nozzle 304b.

For example, while the above-described embodiment and the modified examples are described by way of an example in which the film containing silicon as the main element is formed on the substrate (wafer), the above-described technique is not limited thereto. For example, the above-described technique may be preferably applied to form on the substrate a film containing a metalloid element such as germanium (Ge) and boron (B) as a main element other than silicon. In addition, the above-described technique may be preferably applied to form on the substrate a film containing a metal element such as titanium (Ti), zirconium (Zr), hafnium (Hf), niobium (Nb), tantalum (Ta), molybdenum (Mo), tungsten (W), yttrium (Y), lanthanum (La), strontium (Sr) and aluminum (Al) as a main element.

For example, the above-described technique may be applied to form on the substrate films such as a titanium nitride film (TiN film), a titanium oxynitride film (TiON film), a titanium aluminum carbonitride film (TiAlCN film), a titanium aluminum carbide film (TiAlC film), a titanium carbonitride film (TiCN film) and a titanium oxide film (TiO film). For example, gases such as titanium tetrachloride ($TiCl_4$) gas and trimethylaluminum ($Al(CH_3)_3$, abbreviated as TMA) gas may be used when forming the films described above.

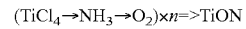

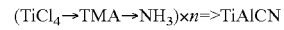

(TiCl$_4$→TMA)×$n$=>TiAlC (TiCl$_4$→TEA)×$n$=>TiCN (TiCl$_4$→H$_2$O)×$n$=>TiO

The recipe used for the substrate processing may be separately prepared depending on the contents of the substrate processing, and stored in the memory 121*c* through an electrical telecommunication line or the external memory 123. When the substrate processing is started, the CPU 121*a* may select a proper recipe among a plurality of recipes stored in the memory 121*c*, depending on the contents of the substrate processing. Thus, it is possible to form plural kinds of films of various composition ratios, qualities and thicknesses by only a single substrate processing apparatus in a universal and highly reproducible manner. Furthermore, it is possible to reduce the burden of an operator, and to start the substrate processing promptly without an operation mistake.

The above-described recipes are not limited to newly created recipes. For example, an existing recipe which is already installed in the substrate processing apparatus may be changed to a new recipe. When a recipe is to be changed, the recipe may be installed in the substrate processing apparatus through an electrical communication line or a recording medium in which the recipe is written. The input/output device 122 installed in the existing substrate processing apparatus may be operated to directly change the existing recipe which is already installed in the substrate processing apparatus to the new recipe.

The above-described embodiment and the modified examples may be appropriately combined. The process sequences and the process conditions of the combinations may be substantially the same as those of the above-described embodiment.

Films such as the SiN film formed in accordance with the above-described embodiment or the modified examples may be widely used, for example, as an insulating film, a spacer film, a mask film, a charge storage film and a stress control film. In recent years, as the semiconductor device is miniaturized, a thickness uniformity of the film formed on the surface of the wafer is more strictly demanded. The above-described technique capable of forming a film of a flat distribution on a patterned substrate with a high-density pattern formed thereon is very useful as a technique for responding to this demand.

EXAMPLES

Hereinafter, simulation results and evaluation results that support the effects obtained in the embodiment and the modified examples described above will be described with reference to FIGS. 8 through 12.

Figure 8A:
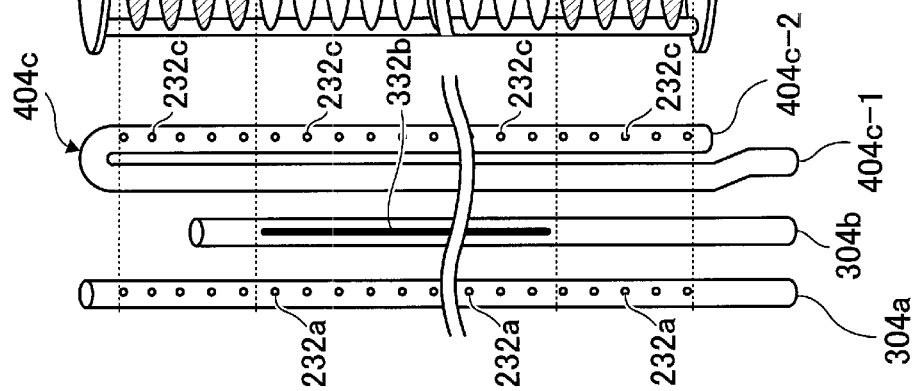
FIG. 8A schematically illustrates a positional relationship between nozzles according to a comparative example described herein and the substrate accommodated in the substrate retainer, and FIG. 8B schematically illustrates a positional relationship between the nozzles according to an example of the embodiment described herein and the substrate accommodated in the substrate retainer.

According to a comparative example, the gases are supplied to the plurality of wafers including the wafer 200 stacked in a multistage manner on the boat 217 by using the three nozzles 304*a*, 404*b* and 404*c* shown in FIG. 8A. Specifically, each of the flow rates of the N2 gas supplied through the nozzle 304*a* and the nozzle 404*c* is set to 100 sccm, and the flow rate of the HCDS gas supplied through the nozzle 404*b* are set to 480 sccm. An opening 432*b* configured to supply the HCDS gas are provided on the side surface of the nozzle 404*b* in the upper dummy wafer support region, the product wafer support region and the lower dummy wafer support region.

Figure 8B:
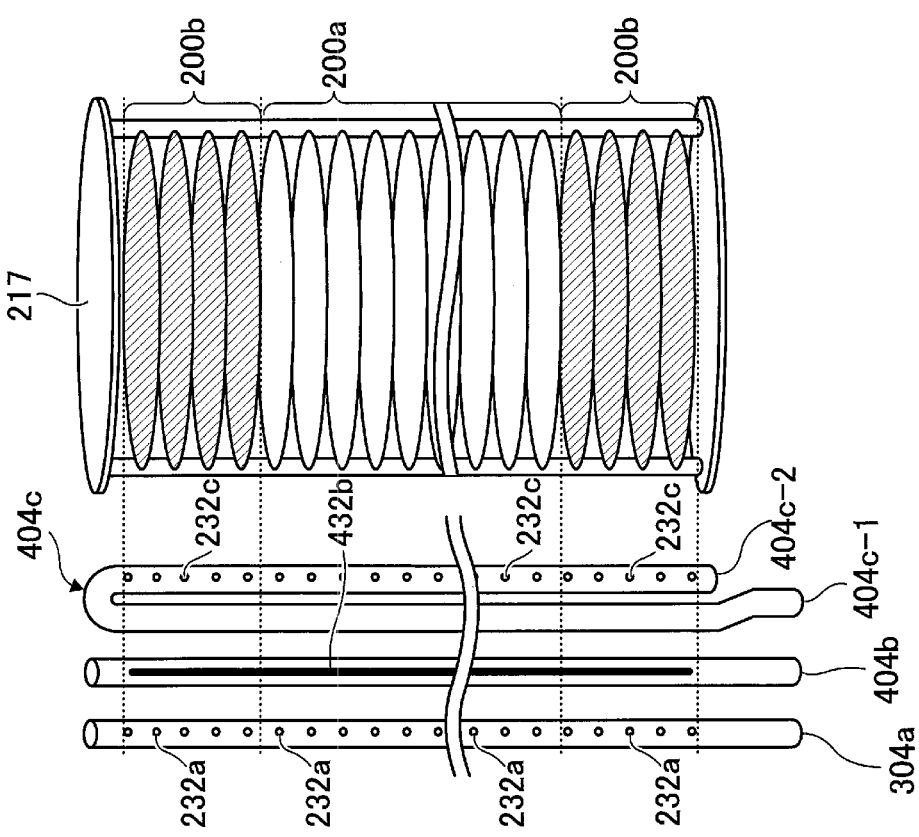

According to an example of the present embodiment, the gases are supplied to the plurality of the wafers including the wafer 200 stacked in a multistage manner on the boat 217 by using the three nozzles 304*a*, 304*b* and 404*c* shown in FIG. 8B according to the third modified example described above. Specifically, each of the flow rates of the N$_2$ gas supplied through the nozzle 304*a* and the nozzle 404*c* are set to 500 sccm, and the flow rate of the HCDS gas supplied through the nozzle 304*b* are set to 480 sccm.

Figure 9A:
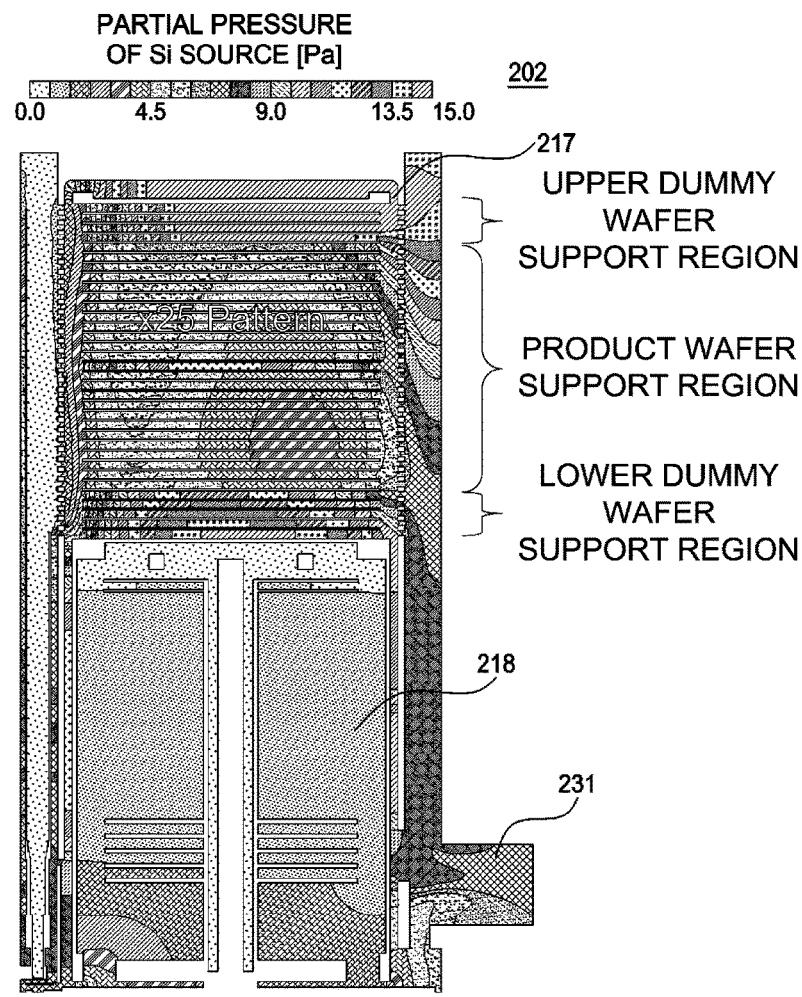
FIG. 9A schematically illustrates a simulation result showing a concentration distribution of a silicon source in the vertical type process furnace when the nozzles according to the comparative example shown in FIG. 8A are used, and FIG. 9B schematically illustrates a thickness distribution of a film on a surface of a product wafer and a thickness distribution of the film among a plurality of product wafers shown in FIG. 9A.
Figure 9B:
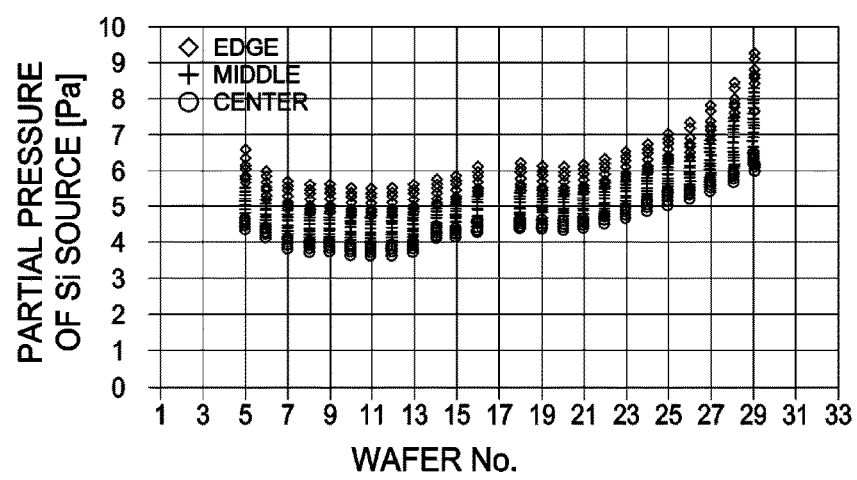
Figure 10A:
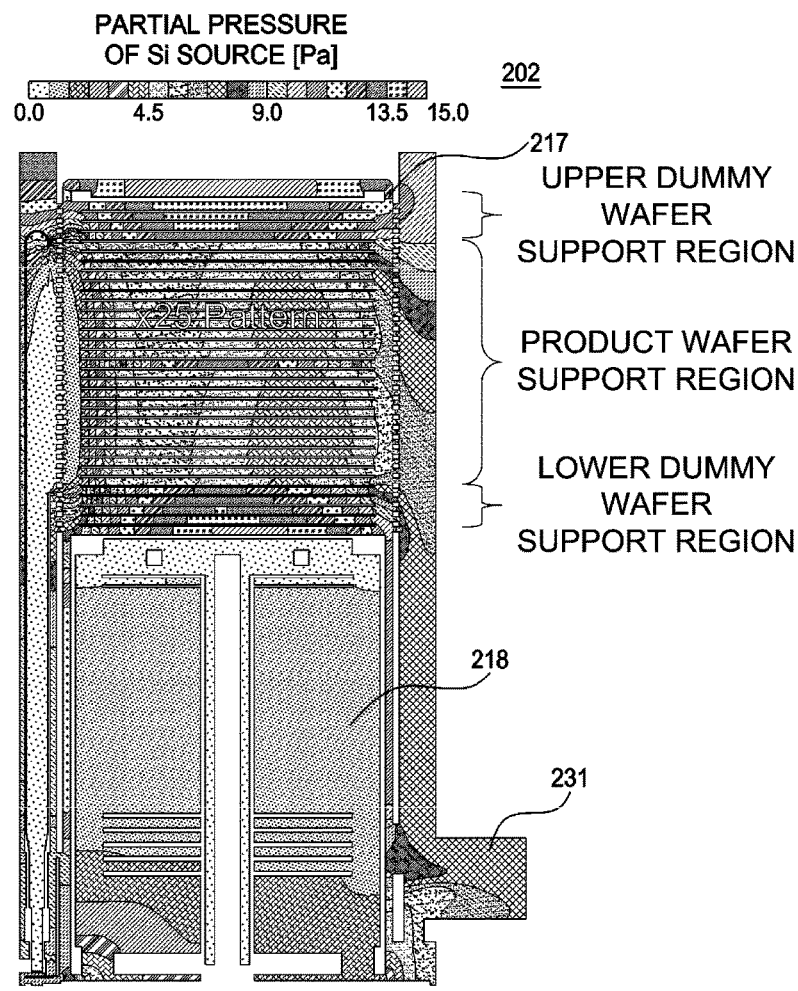
FIG. 10A schematically illustrates a simulation result showing a concentration distribution of a silicon source in the vertical type process furnace when the nozzles according to the example of the embodiment shown in FIG. 8B are used, and FIG. 10B schematically illustrates a thickness distribution of the film on the surface of the product wafer and a thickness distribution of the film among the plurality of the product wafers shown in FIG. 10A.
Figure 10B:
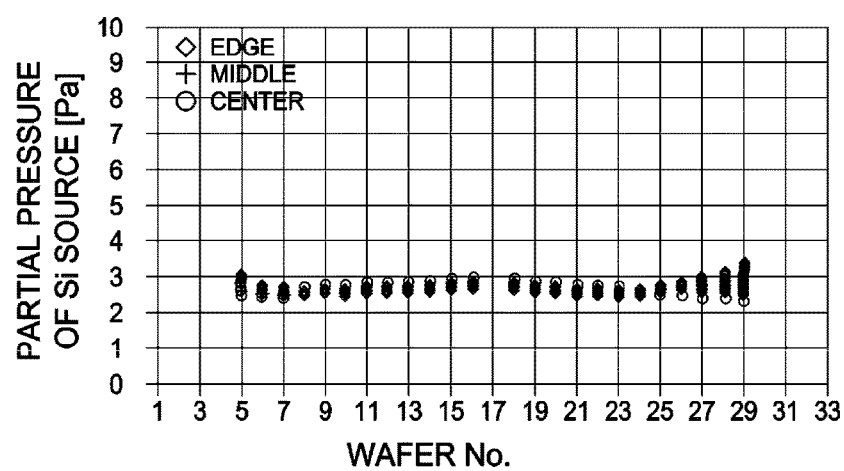

FIG. 9A schematically illustrates the simulation result showing a concentration distribution of the silicon source in the process furnace 202 when the nozzles according to the comparative example shown in FIG. 8A are used, and FIG. 9B schematically illustrates the thickness distribution of the film on the surface of the product wafer and the thickness distribution of the film among the product wafers including the product wafer shown in FIG. 9A. FIG. 10A schematically illustrates the simulation result showing a concentration distribution of the silicon source in the process furnace 202 when the nozzles according to the example of the embodiment shown in FIG. 8B are used, and FIG. 10B schematically illustrates the thickness distribution of the film on the surface of the product wafer and the thickness distribution of the film among the plurality of the product wafers including the product wafer shown in FIG. 10A. The vertical axis shown in FIGS. 9B and 10B represents a partial pressure [Pa] of the silicon source. The horizontal axis shown in FIGS. 9B and 10B represents a wafer number (wafer serial number) of the product wafers placed on the boat 217.

As shown in FIG. 9A, when the nozzles according to the comparative example are used, the opening 432*b* is also provided in the upper dummy wafer support region and the lower dummy wafer support region on the side surface of the nozzle 404*b* configured to supply the source gas. Therefore, the source gas is uniformly supplied from the top to the bottom of the boat 217. However, since the dummy wafer supported in the dummy wafer support region is a flat wafer and the product wafer on which the pattern is formed is a structural wafer whose surface area is large, the consumption of the source gas is different between the dummy wafer and the product wafer. Therefore, the concentration (partial pressure) of the silicon source in the process chamber 201 is different among the upper dummy wafer support region, the lower dummy wafer support region and the product wafer support region. In the upper dummy wafer support region and the lower dummy wafer support region, the concentration of the silicon source increases because the excess gas is large. In the product wafer support region, the concentration of the silicon source decreases. When a concentration difference of the silicon source occurs in the process chamber 201, the concentration difference also occurs even in the product wafer support region due to a concentration diffusion. Specifically, the concentration (partial pressure) of the silicon source in a region in the product wafer support region in the vicinity of the upper dummy wafer support region or the lower dummy wafer support region may be different from the concentration (partial pressure) of the silicon source in a region far from the upper dummy wafer support region or the lower dummy wafer support region. Therefore, the uniformity of the film formed on the product wafer may deteriorate.

In addition, as shown in FIG. 9B, when the nozzles according to the comparative example are used, the partial pressure of the silicon source supplied around the edge within the surface of the wafer is different from the partial pressure of the silicon source supplied to the center within the surface of the wafer. On the other hand, as shown in FIG. 10B, it is confirmed that, when the nozzles according to the example of the embodiment are used, the uniformity on the surface of the wafer is desirable.

In addition, as shown in FIG. 9B, when the nozzles according to the comparative example are used, the partial pressure of the silicon source supplied to the plurality of the wafers stacked in the height direction of the boat 217 varies depending on the position of each of the plurality of the wafers. On the other hand, as shown in FIG. 10B, it is confirmed that, when the nozzles according to the example of the embodiment are used, the uniformity among the plurality of the wafers is desirable. That is, according to the example of the embodiment, it is possible to improve a uniformity of the concentration of the silicon source supplied to the product wafer.

That is, when the nozzles according to the example of the embodiment are used, it is possible to uniformize the concentration of the silicon source in the height direction of the plurality of the wafers stacked in the boat 217 as compared with the case where the nozzles according to the comparative example are used. In particular, it is confirmed that it is possible to reduce the concentration of the silicon source on the upper portion and the lower portion of the boat 217 and to improve the uniformity among the plurality of the wafers.

Figure 11:
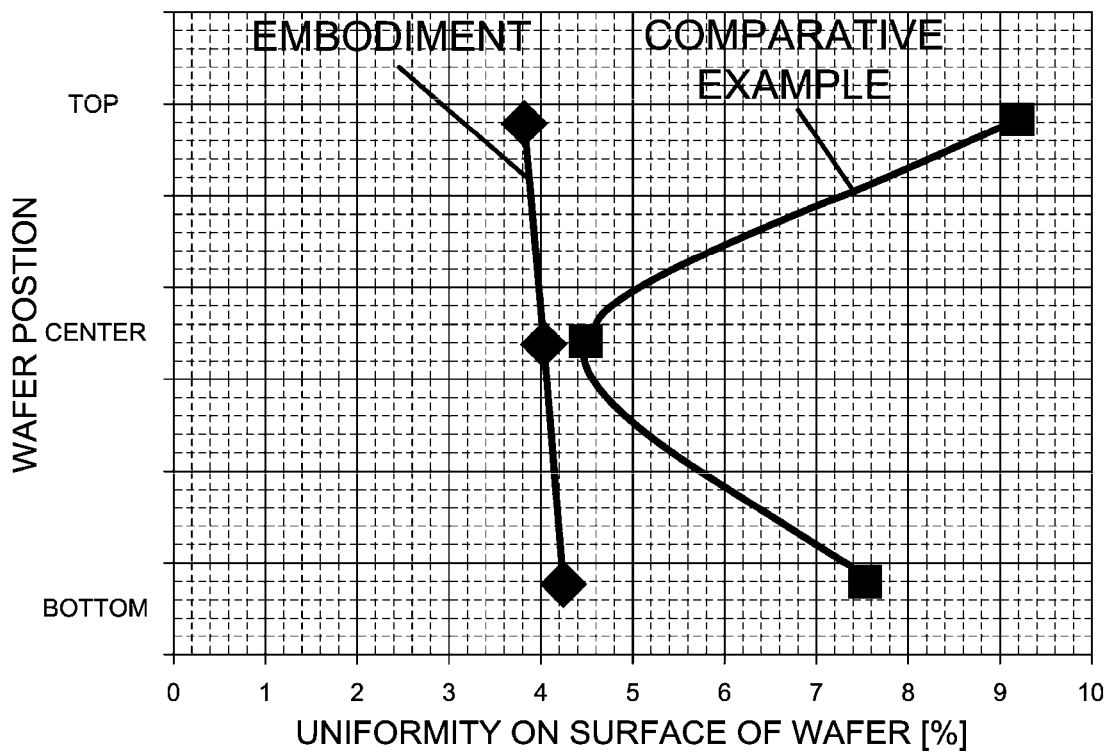
FIG. 11 schematically illustrates evaluation results of thickness distributions of the film on a surface of a substrate ("WiW") when the film is formed using the nozzles according to the comparative example and the nozzles according to the example of the embodiment.
Figure 12:
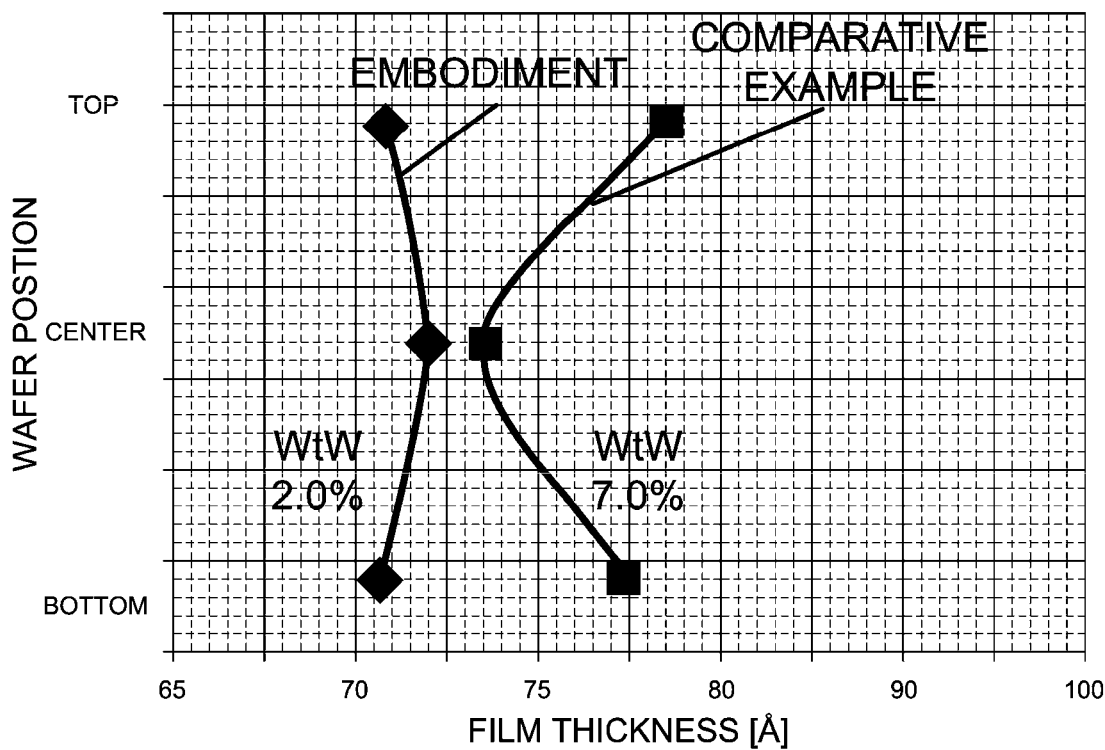
FIG. 12 schematically illustrates evaluation results of thickness distributions of the film among a plurality of substrates including the substrate ("WtW") when the film is formed using the nozzles according to the comparative example and the nozzles according to the example of the embodiment.

FIG. 11 schematically illustrates comparison results of thickness distributions of the SiN film on the surface of the product wafer when the SiN film is formed on the product wafer using the nozzles according to the comparative example and the nozzles according to the example of the embodiment. FIG. 12 schematically illustrates comparison results of thickness distributions of the SiN film among the plurality of the product wafers when the SiN film is formed on the plurality of the product wafers using the nozzles according to the comparative example and the nozzles according to the example of the embodiment. The vertical axis shown in FIG. 11 represents a wafer position. The horizontal axis shown in FIG. 11 represents the uniformity [%] on the surface of the product wafer. The vertical axis shown in FIG. 12 represents the wafer position. The horizontal axis shown in FIG. 12 represents the thickness [Å] of the SiN film formed on the product wafer.

As shown in FIG. 11, the uniformity of the film (SiN film) on the surface of the product wafer is about 4.5% at a center portion ("CENTER" in FIG. 11) of the boat 217, about 7.5% at the lower portion ("BOTTOM" in FIG. 11) of the boat 217, and about 9.2% at the upper portion ("TOP" in FIG. 11) of the boat 217 when the film is formed using the nozzles according to the comparative example. That is, the uniformity of the film on the surface of the product wafer varies greatly depending on the height position of the product wafer. On the other hand, the uniformity of the film on the surface of the product wafer is about 4% when the film is formed using the nozzles according to the example of the embodiment. That is, the uniformity of the film on the surface of the product wafer shows almost no difference along the height direction of the boat 217.

In addition, as shown in FIG. 12, the uniformity of the film among the plurality of the wafers is about 7% when the film is formed using the nozzles according to the comparative example. On the other hand, it is confirmed that, when the film is formed using the nozzles according to the example of the embodiment, the uniformity of the film among the plurality of the wafers is about 2%. That is, the uniformity of the film among the plurality of the wafers is also desirable.

That is, as compared with the case when the nozzles according to the comparative example are used, the uniformity of the film thickness among the product wafers stacked in the boat 217 is desirable from the lower portion to the upper portion in the height direction of the boat 217 when the nozzles according to the example of the embodiment are used, and it is possible to obtain a uniform film thickness among the product wafers stacked in a multistage manner in the boat 217 from the lower portion to the upper portion of the boat 217 when the nozzles according to the example of the embodiment are used.

As described above, according to some embodiments in the present disclosure, it is possible to improve the uniformity of the film on the surface of the substrate and the uniformity of the film among the plurality of the substrates including the substrate.

What is claimed is:
1. A substrate processing apparatus comprising:
a process chamber configured to accommodate a substrate retainer, the process chamber comprising:
an exhaust part configured to discharge a fluid in the process chamber to an outside thereof; and
a supply part disposed at a position opposite to a position of a discharge part and configured to supply process gases capable of processing a plurality of substrates in the process chamber;
a gas supply area configured to communicate with the process chamber through the supply part;
a plurality of injectors extending in an axial direction and arranged in the gas supply area in a circumferential direction and comprising:
a first injector provided with, on a side surface thereof, a plurality of first ejection holes configured to eject an inert gas into the process chamber through the supply part;
a second injector provided with, on a side surface thereof, at least one opening configured to eject a source gas, which is one of the process gases and thermally decomposable, into the process chamber; and
a third injector provided with, on a side surface thereof, a plurality of third ejection holes configured to eject a reactant gas and the inert gas into the process chamber, wherein the third injector is provided such that the second injector is arranged between the first injector and the third injector, and wherein the reactant gas is able to modify a layer formed by supplying the source gas to the substrate;
a plurality of gas supply pipes through which the plurality of injectors communicate with a plurality of gas supply sources, respectively, wherein the plurality of gas supply sources comprise the source gas, the reactant gas and the inert gas, wherein at least one of the source gas or the reactant gas comprises an element constituting a film to be formed on the substrate; and
a controller capable of controlling a supply amount or a flow rate of the inert gas through the plurality of third ejection holes while controlling a supply amount or a flow rate of the source gas ejected through the at least one opening so that the first injector and the third injector simultaneously supply the inert gas so as to lower a concentration of the source gas and uniformize a thickness of a film to be formed on substrates in a middle region of the substrate retainer among the plurality of substrates,
wherein the at least one opening is arranged across the plurality substrates in the middle region of the substrate retainer,
wherein the first injector comprises an ascending pipe that comprises a first hole-free region where no ejection hole is provided, the first hole-free region vertically extending so as to include the middle region, wherein at least a part of the plurality of first ejection holes are formed only in a lower region vertically extending from a bottom of the middle region to a lower end of the substrate retainer and/or an upper region vertically extending from a top of the middle region to an upper end of the substrate retainer, and wherein the second injector comprises a second hole-free region where no opening is provided, the second hole-free region vertically extending across the lower region.

2. The substrate processing apparatus of claim 1, wherein the second injector comprises a vertically elongated slit as the at least one opening, wherein the third injector comprises an ascending pipe and each of the first injector and the third injector comprises a descending pipe, and the ascending pipe of the third injector comprises a third hole-free region where no ejection hole is provided, the third hole-free region vertically extending so as to include the middle region and wherein the at least one opening of the second ejector is arranged from a lower end to an upper end of the middle region, a height of a lower end of the at least one opening is substantially the same as that of a lower end of the first hole-free region, and a height of an upper end of the at least one opening is substantially same as that of an upper end of the third hole-free region.

3. The substrate processing apparatus of claim 1, wherein the third injector is capable of purging or diluting an excess of the source gas by ejecting the inert gas more through a plurality of ejection holes provided in at least one of the upper region and the lower region in which no ejection hole of the second injector is provided than in the middle region between the upper region and the lower region.

4. The substrate processing apparatus of claim 2, wherein the first ejection holes are provided at the ascending pipe and the descending pipe of the first injector and are configured to eject the inert gas and the reactant gas, and wherein the third ejection holes are provided at the ascending pipe and the descending pipe of the third injector and are configured to eject the inert gas and the reactant gas.

5. The substrate processing apparatus of claim 2, wherein a first ratio of an opening width of the first ejection holes averaged along a longitudinal direction to a square root of a cross-sectional area of a flow path of the first injector is less than a second ratio of an opening width of the vertically elongated slit to a square root of a cross-sectional area of a flow path of the second injector.

6. The substrate processing apparatus of claim 5, wherein the first ratio is 1% or less.

7. The substrate processing apparatus of claim 5, wherein the second ratio is 3% or more.

8. The substrate processing apparatus of claim 2, wherein a substantial opening area of at least one of the first ejection holes or the third ejection holes obtained by averaging out those opening areas within the upper region and the lower region is greater than a substantial opening area of the gas supply holes obtained by averaging out those opening areas within the middle region between the upper region and the lower region.

9. The substrate processing apparatus of claim 2, wherein the gas supply area comprises inner walls that divide an inner space of the gas supply area into three spaces in which the first injector, the second injector and the third injector are arranged respectively.

10. The substrate processing apparatus of claim 4, wherein the descending pipe of the first injector is connected to an upper end of the ascending pipe of the first injector, and wherein the descending pipe of the third injector is connected to an upper end of the ascending pipe of the third injector.

11. The substrate processing apparatus of claim 10, wherein the ascending pipe of the first injector is provided with a part of the first ejection holes only within an upper region and a lower region of the first injector and the descending pipe of the first injector is provided with the other part of the first ejection holes within the upper region, the lower region and a middle region of the first injector between the upper region and the lower region.

12. The substrate processing apparatus of claim 11, wherein the ascending pipe of the first injector is arranged nearer to the second injector than the descending pipe of the first injector, and wherein the ascending pipe of the third injector is arranged nearer to the second injector than the descending pipe of the third injector.

13. The substrate processing apparatus of claim 1, wherein the second injector is able to eject the inert gas when the third injector ejects the reactant gas and eject the source gas when the third injector does not eject the reactant gas.

14. A substrate processing apparatus comprising:
a substrate retainer comprising:
a first substrate support region configured to support a first plurality of substrates;
a second substrate support region provided above the first substrate support region and configured to support a second plurality of substrates; and
a third substrate support region provided below the first substrate support region and configured to support a third plurality of substrates;
a process chamber in which the substrate retainer is accommodated;
a first gas supplier, a second gas supplier and a third gas supplier configured to supply gases into the process chamber and extending along the substrate retainer; and
a plurality of gas supply holes provided at each of the first gas supplier and the third gas supplier,
wherein the first gas supplier, the second gas supplier and the third gas supplier are provided in a same gas supply area,
wherein the plurality of gas supply holes of the first gas supplier are arranged corresponding to substrates supported in at least the second substrate support region and are not arranged corresponding to substrates supported in the first substrate support region,
wherein the plurality of gas supply holes of the third gas supplier are arranged corresponding to substrates supported in at least the third substrate support region and are not arranged corresponding to substrates supported in the first substrate support region, and
wherein the second gas supplier comprises a vertically elongated slit arranged corresponding to substrates supported in at least the first substrate support region,
wherein each of the first gas supplier and the third gas supplier comprises an ascending pipe and a descending pipe, and the ascending pipe of each of the first gas supplier and the third gas supplier comprises a first hole-free region where no gas supply hole is provided, the first hole-free region vertically extending across the first substrate support region, wherein the vertically elongated slit of the second gas supplier extends from a lower end thereof to an upper end thereof, a height of a lower end of the vertically elongated slit is substantially the same as that of a lower end of the first hole-free region, and a height of an upper end of the vertically elongated slit is substantially the same as that of an upper end of the hole-free region, and the second injector comprises a second hole-free region where no opening is provided, the second hole-free region vertically extending across a lower region of the substrate retainer.

15. The substrate processing apparatus of claim 14, wherein the second substrate support region is a first dummy wafer region, and the third substrate support region is a second dummy wafer region.

16. The substrate processing apparatus of claim 14, wherein the first gas supplier and the third gas supplier are dilution gas suppliers and the second gas supplier is a source gas supplier.

17. A method of manufacturing a semiconductor device comprising:

providing the substrate processing apparatus of claim 1, and processing the substrate by performing:
(a) ejecting the source gas into the process chamber through the second injector; and
(b) ejecting the reactant gas into the process chamber through the third injector.

18. A method of manufacturing a semiconductor device comprising:

providing the substrate processing apparatus of claim 14, and processing the substrate by performing:
(a) ejecting a source gas into the process chamber through the second gas supplier; and
(b) ejecting a dilution gas into the process chamber through at least one of the first gas supplier and the third gas supplier.

19. A non-transitory tangible medium storing a program executable by a computer for performing the method of claim 17.

20. A non-transitory tangible medium storing a program executable by a computer for performing the method of claim 18.

* * * * *